(12) United States Patent
Shiota et al.

(10) Patent No.: US 8,395,726 B2
(45) Date of Patent: Mar. 12, 2013

(54) OPTICAL ELEMENT MANUFACTURING METHOD, OPTICAL ELEMENT EXPOSURE DEVICE, OPTICAL ELEMENT, LIGHTING OPTICAL DEVICE, DISPLAY DEVICE, AND ELECTRONIC APPARATUS

(75) Inventors: Kunihiro Shiota, Kanagawa (JP); Koji Mimura, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 254 days.

(21) Appl. No.: 12/890,730

(22) Filed: Sep. 27, 2010

(65) Prior Publication Data

US 2011/0080538 A1    Apr. 7, 2011

(30) Foreign Application Priority Data

Sep. 29, 2009 (JP) ................................. 2009-224458
Aug. 3, 2010 (JP) ................................. 2010-174504

(51) Int. Cl.
*G02F 1/1335* (2006.01)
*F21V 11/02* (2006.01)
*G02B 27/00* (2006.01)

(52) U.S. Cl. ............. 349/66; 349/61; 349/62; 362/290; 359/613

(58) Field of Classification Search ............ 349/62, 349/66, 61; 359/613; 362/290
See application file for complete search history.

(56) References Cited

U.S. PATENT DOCUMENTS

| | | | | |
|---|---|---|---|---|
| 3,919,559 A | * | 11/1975 | Stevens | 378/154 |
| 6,092,901 A | * | 7/2000 | Hashizume et al. | 362/19 |
| 6,398,370 B1 | * | 6/2002 | Chiu et al. | 359/613 |
| 6,770,865 B2 | * | 8/2004 | Wootton et al. | 250/226 |
| 7,470,054 B2 | * | 12/2008 | Lee | 362/625 |
| 7,916,241 B2 | * | 3/2011 | Mimura et al. | 349/62 |
| 8,233,114 B2 | * | 7/2012 | Mimura et al. | 349/62 |
| 2003/0234349 A1 | * | 12/2003 | Wootton et al. | 250/226 |
| 2006/0103779 A1 | * | 5/2006 | Amemiya et al. | 349/95 |
| 2007/0121325 A1 | * | 5/2007 | Barber | 362/290 |
| 2008/0089068 A1 | * | 4/2008 | Mimura et al. | 362/292 |
| 2011/0080538 A1 | * | 4/2011 | Shiota et al. | 349/61 |
| 2011/0176312 A1 | * | 7/2011 | Mimura et al. | 362/311.01 |

FOREIGN PATENT DOCUMENTS

| | | |
|---|---|---|
| JP | 02-247647 | 10/1990 |
| JP | 2005-343115 | 12/2005 |
| JP | 2007-334279 | 12/2007 |
| JP | 2008-116913 | 5/2008 |

* cited by examiner

*Primary Examiner* — Rhonda Peace
(74) *Attorney, Agent, or Firm* — Young & Thompson

(57) ABSTRACT

Provided is an optical element manufacturing method that is capable of forming various kinds of shapes and capable of achieving sophisticated functions, improved yields, and cost reductions. The method includes: a step that applies a transparent photosensitive resin on a transparent substrate with light-shielding patterns provided thereon; a step that forms transparent layers by performing patterning through irradiating exposure light of an arbitrary amount on the transparent photosensitive resin via the transparent substrate with the light-shielding patterns provided thereon; a step that forms light absorption layers by filling a black curable resin between the transparent layers; and an irradiation step that irradiates the exposure light in an oblique direction to the surface of the transparent substrate where the light-shielding patterns are formed in a state where the transparent substrate is being bent.

20 Claims, 20 Drawing Sheets

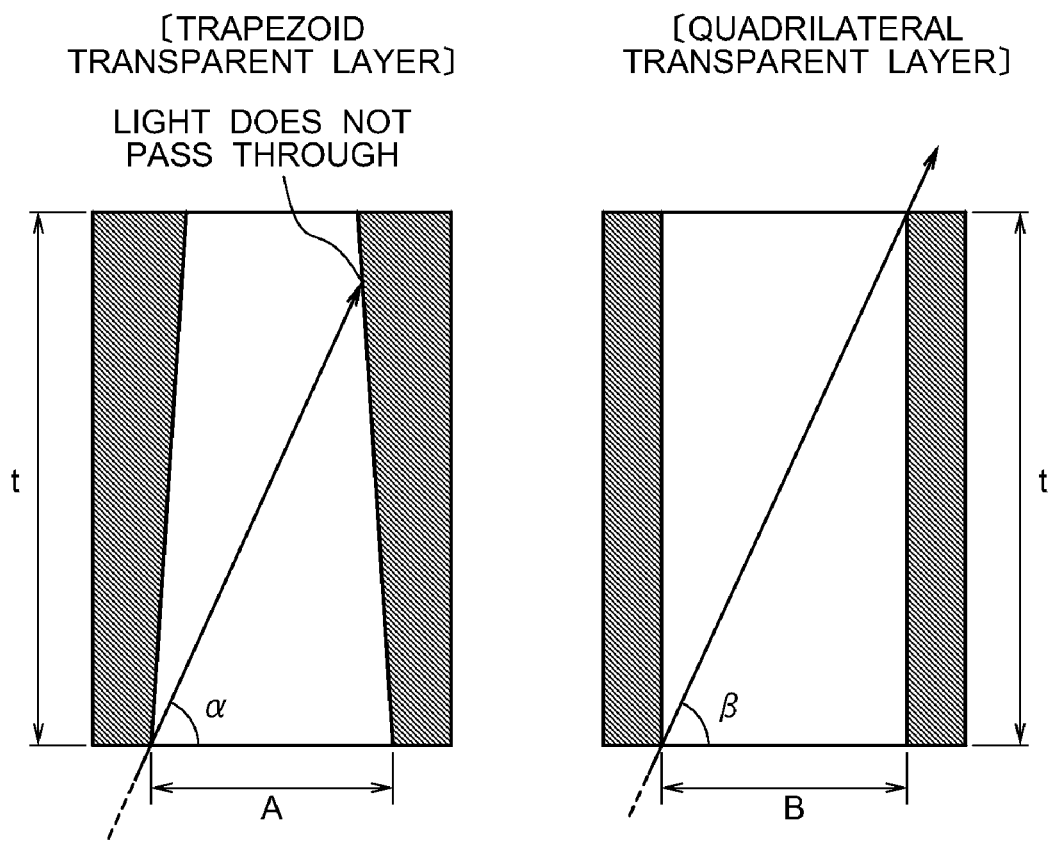

FIG.6A
FIG.6B
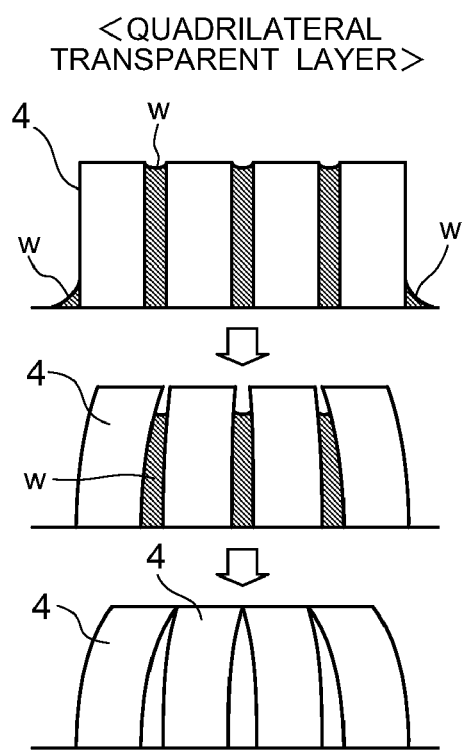
<QUADRILATERAL TRANSPARENT LAYER>
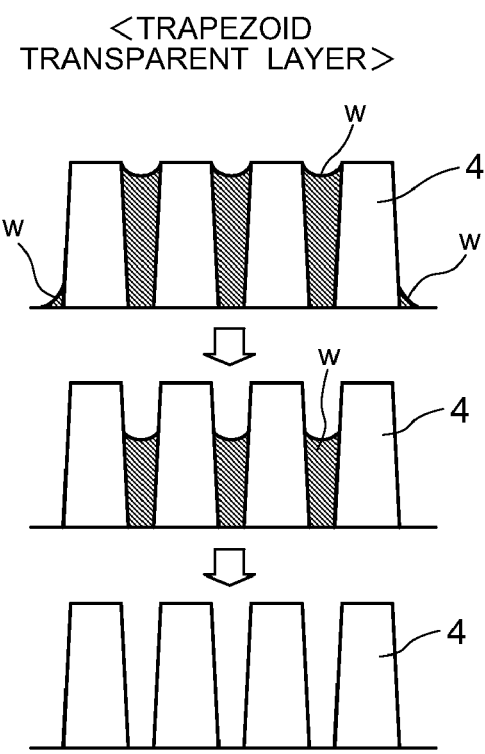
<TRAPEZOID TRANSPARENT LAYER>

<SPACES BETWEEN PATTERNS BECOME WIDE WITH EXPOSURE AMOUNT TO BE TRAPEZOID>

<PATTERNS BECOME QUADRILATERALS WITH EXPOSURE AMOUNT WITH WHICH SPACES BETWEEN PATTERNS BECOME ADEQUATE>

PERSPECTIVE VIEW

PLAN VIEW

A—A' SECTIONAL VIEW

CASE WHERE SAME LIGHT-SHIELDING PATTERNS ARE FORMED IN LONGITUDINAL DIRECTION OF SUBSTRATE

CASE WHERE A PLURALITY OF DIFFERENT LIGHT-SHIELDING PATTERNS ARE FORMED

CASE WHERE A PLURALITY OF LIGHT-SHIELDING PATTERNS LINED IN SHORT-SIDE DIRECTION OF TRANSPARENT SUBSTRATE IN A GROUP ARE SEQUENTIALLY FORMED IN LONGITUDINAL DIRECTION OF SUBSTRATE

OPTICAL ELEMENT MANUFACTURING METHOD, OPTICAL ELEMENT EXPOSURE DEVICE, OPTICAL ELEMENT, LIGHTING OPTICAL DEVICE, DISPLAY DEVICE, AND ELECTRONIC APPARATUS

CROSS-REFERENCE TO RELATED APPLICATIONS

This application is based upon and claims the benefit of priority from Japanese patent application No. 2009-224458, filed on Sep. 29, 2009 and Japanese patent application No. 2010-174504, filed on Aug. 3, 2010 the disclosure of which is incorporated herein in its entirety by reference.

BACKGROUND OF THE INVENTION

1. Field of the Invention

The present invention relates to a manufacturing method of an optical element called a microlouver whose transmission light emitting direction range is limited, an exposure device used for manufacturing the optical element, an optical element, a liquid crystal display device (LCD: Liquid Crystal Display) using the optical element, a display device such as a plasma display, a lighting optical device, and an electronic apparatus.

2. Description of the Related Art

Conventionally, liquid crystal display devices are used as display devices of various kinds of information processing devices such as mobile phones, portable information terminals (PDAs: Personal Digital Assistants), ATMs (Automatic Teller Machines), and personal computers. Recently, liquid crystal display devices of a wide visible range have been put into practical use.

For this type of liquid crystal display device, various light distribution properties have come to be required due to increased scale and multiple purposes of recent displays. In particular, there have been increased demands for limiting the visible range so as not to be peeped from others and demands for not emitting light to unnecessary directions in regards to information leakages. For meeting those demands, displays to which a microlouver is added to restrict the visible range (or emission range) have been proposed, and a part of which has been put into practical use.

In a case where a microlouver is applied to a large-scaled display, a center part of the large-scaled display is displayed brightly so that it is possible to recognize an image when an observer observes the large-scaled display from a position corresponding to almost the center part of the large-scaled display.

In the meantime, the peripheral part of the large-scaled display is displayed dark in general, so that it is difficult to recognize an image. As a result, there may be cases where the observer cannot finely recognize the entire image displayed on the large-scaled display.

As shown in the sectional structure of FIG. 20, this is because a light absorption layer 201a of a microlouver 201 provided on the front face of a display 200 is formed almost in a perpendicular direction with respect to the surface of the display 200.

In the case of FIG. 20, the viewing angle with a microlouver in which the height of the light absorption layer is 120 µm, for example, the width is 10 µm, and the pitch is 50 µm is ±18 degrees. However, when the microlouver is added to the front face of the display and viewed at a distance of 60 cm from the screen, it is known that the angle of view at both ends of the display becomes ±24 degrees or more with the display size of 26 inches diagonally (aspect ratio of 3:4). Therefore, the image cannot be visually recognized.

In order to avoid such phenomenon, the light absorption layer needs to be tilted towards the center of the screen so as not to interrupt visual recognition of the observer even when the observer views the both ends of the display. When viewing the display of the above-described size of 26 inches diagonally (aspect ratio of 3:4) at a distance of 60 cm from the screen, a tilt angle of 24 degrees is required for visually recognizing the both ends of the display in the brightness equivalent to that of the center of the display.

Japanese Unexamined Patent Publication 2008-116913 (Patent Document 1: Method for Manufacturing Optical Element) discloses a manufacturing method of a microlouver having the prescribed light distribution property. In the case of the microlouver disclosed in Patent Document 1, first, a mask is disposed on a transparent photosensitive resin, and exposure light is irradiated over the mask to pattern the transparent photosensitive resin so as to form a transparent layer.

Further, diffused light from a point light source or light refracted by a Fresnel lens is used for the exposure light at this time, so that the light makes incident obliquely on the mask face. Thereafter, a black curable resin is filled between the transparent layers to form the light absorption layers. Through those steps, a microlouver having the light distribution property with which light is converged to a prescribed position can be obtained.

Further, Japanese Unexamined Patent Publication 2007-334279 (Patent Document 2: Method for Manufacturing Light-Ray Direction Control Element) discloses a structure of a microlouver in which laminate patterns of an aluminum light-shielding pattern and a light absorption pattern are formed on a substrate, and a transparent layer is formed between the laminate patterns. As disclosed in Japanese Unexamined Patent Publication 2005-343115 (Patent Document 3: Method for Creating Resist Pattern) and Japanese Unexamined Patent Publication Hei 02-247647 (Patent Document 4: Method for Manufacturing Mask), the microlouver depicted in Patent Document 2 can be formed by: forming a transparent photosensitive resin on a transparent substrate after forming a light-shielding pattern on the surface of the transparent substrate; exposing it by irradiating light from the back side of the transparent substrate; and developing the transparent photosensitive resin thereafter to form the transparent layer on the transparent substrate.

However, in a case where the transparent layer is formed by patterning the transparent photosensitive resin by using the exposure light that makes incident on the mask face in the oblique direction from a point light source, obtained is the pattern tilted entirely except for the center of the substrate with the technique of the method for manufacturing the optical element disclosed in Patent Document 1. Therefore, it is difficult to form patterns on other various kinds of shapes, such as a pattern having a transparent layer that is not tilted except for the center of the substrate, for example.

Such difficulty also occurs in the case where the transparent photosensitive resin is exposed by utilizing a light-shielding pattern formed in advance on the transparent layer as in the cases of Patent Document 2 and Patent Document 4.

Further, with the above-described technique disclosed in Patent Document 1, it is impossible to completely make the light-shielding pattern on the mask and the transparent photosensitive resin fitted closely due to deterioration in the surface flatness caused by edge bead generated in an edge part of the region to which the transparent photosensitive resin is applied and variation in the film thickness within the applied region and due to undulation of the substrate surface on which the transparent photosensitive resin is formed. Deterioration in the resolution and variation in the patterns are generated because of the gap generated as a result, thereby causing a decrease in the yield and inducing a cost increase.

Furthermore, with the technique depicted in Patent Document 1 described above, the transparent layer is formed by refracting the incident light to the oblique direction by the Fresnel lens, and it is used as the exposure light to form the transparent layer. However, formation of the refracted light depends on the complicated shape of the Fresnel lens, so that deterioration in the yield tends to occur depending on the fault in the shape of the Fresnel lens. This deteriorates the productivity and induces a cost increase at the same time.

An exemplary object of the present invention is to improve the above-described inconveniences, and to provide a manufacturing method of an optical element capable of easily forming various kinds of shapes in accordance width the demands, and capable of increasing the functions without using a complicated component such as a Fresnel lens as well as improving the yield and reducing the cost, and to provide an optical element exposure device to which the manufacturing method is employed, an optical element manufactured by the exposure device, and a lighting optical device, a display device, and an electronic apparatus to which the optical element is loaded.

SUMMARY OF THE INVENTION

In order to achieve the foregoing exemplary object, the optical element manufacturing method according to an exemplary aspect of the invention is characterized to include and sequentially execute: laminating a transparent photosensitive resin on a transparent substrate (a transparent photosensitive resin laminating step); bending and holding at least a part of the transparent substrate on which the transparent photosensitive resin is laminated (a substrate bending/holding step); irradiating exposure light constituted with parallel light towards the transparent photosensitive resin while keeping a state of bending at least a part of the transparent substrate to perform patterning on the transparent photosensitive resin, and forming a transparent layers thereby (a transparent layer forming step); setting the transparent substrate in a bent state to an original flat state (transparent substrate flat setting step); and filling a black curable resin in spaces located between each of the transparent layers formed by the patterning to form light absorption layers (a light absorption layer forming step). Further, in order to achieve the foregoing exemplary object, the optical element exposure device according to another exemplary aspect of the invention is characterized to include: a stage section including a stage face on which a transparent substrate that is formed with a material capable of transmitting exposure light and includes a transparent photosensitive resin laminated on its external face is loaded and held; an inner-face light-shielding structure provided on an inner-face side of the stage section to cover an entire surface except an exposure region of the stage face; position detection sensors for position alignment placed on an upper part of the stage face at a prescribed interval by corresponding to alignment marks used for setting an exposure position set in advance in the transparent photosensitive resin part of the transparent substrate; and an exposure light irradiation module that operates and irradiates the exposure light for a prescribed time towards the transparent substrate from the inside the stage to perform patterning processing on the transparent photosensitive resin, when the transparent substrate is loaded at the exposure position on the stage face and the alignment marks on the transparent photosensitive resin are detected by the position detection sensors, wherein at least a part of the stage face of the stage section is formed as a surface structure of a bent state in a convex form.

Note here that the surface structure of the bent state in the convex form which configures the stage face of the optical element exposure device may be formed as a surface structure of a bent state in a concave form.

Further, in order to achieve the foregoing exemplary object, the optical element according to still another exemplary aspect of the invention is characterized to include transparent layers and light absorption layers alternately on a transparent substrate within a same plane, wherein slopes in each of the center line parts of the transparent layers and the light absorption layers are set to be upright with respect to the surface of the transparent substrate in a center region of the transparent substrate, and at least a part of the peripheral region surrounding the center region is in a state tilted towards the center region.

Note here that at least a part of the peripheral region surrounding the center region may be set in a state tilted towards the outer side (an opposite side of the center region), respectively. In that case, in an actual loading, it is loaded by being inverted in terms of the top and back face sides so as to be able to exhibit the same function as the case of the optical element described above.

Further, in order to achieve the foregoing exemplary object, the lighting optical device according to still another exemplary aspect of the invention is characterized to include the optical element described above and a surface light source provided to a back face of the optical element.

In order to achieve the foregoing exemplary object, the display device according to still another exemplary aspect of the invention is characterized to include: a display panel in which pixels are arranged in an orderly manner; the optical element which is mounted into the display panel; and a surface light source that lights up the display panel via the optical element.

Further, in order to achieve the foregoing exemplary object, the display device according to still another exemplary aspect of the invention is characterized to include: a display panel in which pixels are arranged in an orderly manner; the optical element which is mounted into the display panel; a surface light source that lights up the display panel; and a transmission-scattering switching element that receives light from the surface light source via the optical element, and switches a transparent state which transmits and emits the light that makes incident thereon as it is and a scattering state which scatters the light that makes incident thereon and emits the light as diffused light, wherein the light emitted from the transmission-scattering switching element is irradiated to the display panel.

BRIEF DESCRIPTION OF THE DRAWINGS

FIGS. 1A and 1B show illustrations showing a microlouver manufactured by an optical element (microlouver) manufacturing method according to a first exemplary embodiment of the present invention, in which FIG. 1A is a schematic sectional view and FIG. 1B is an explanatory illustration showing a state of a light recycle effect by a metal light-shielding pattern of the microlouver;

FIGS. 2A and 2B show explanatory illustrations showing a difference of the light distribution property generated due to a shape of a transmission layer of the microlouver of FIG. 1, in which FIG. 2A shows a case where the transparent layer is in a trapezoid and FIG. 2B shows a case where the transparent layer is a quadrilateral;

FIGS. 6A and 6B show illustrations showing a state of evaporation of a rinse solution after executing development and a state of change in the shape of the transparent layer generated in manufacturing steps of the microlouver shown in FIG. 1, in which FIG. 6A is an explanatory illustration showing a case of a comparative example where the transparent layer is a quadrilateral and FIG. 6B is an explanatory illustration showing a case where the transparent layer is a trapezoid;

FIGS. 7A and 7B show comparative explanatory illustrations of a case where pattern development is executed by a normal exposure method (photolithography), in which FIG. 7A is an explanatory illustration showing a case where the exposure amount becomes a trapezoid and FIG. 7B is an explanatory illustration showing an example of a case where exposed amount becomes a quadrilateral;

FIGS. 9A and 9B show explanatory illustrations showing the concept of a microlouver manufacturing method according to a third exemplary embodiment of the present invention, in which FIG. 9A is a perspective view and FIG. 9B is a plan view;

FIGS. 11A and 11B show illustrations of an exposure device used for manufacturing a microlouver according to a fourth embodiment of the present invention, in which FIG. 11A is an explanatory illustration showing a state of consecutive manufacturing procedure done by roll-to-roll and FIG. 11B is a schematic plan view of FIG. 11A;

FIGS. 12A, 12B and 12C show illustrations showing light-shielding patterns of a roll transparent substrate used in microlouver manufacturing steps of the fourth exemplary embodiment shown in FIG. 11, in which FIG. 12A is an explanatory illustration showing a case where a same light-shielding pattern is repeatedly printed in the longitudinal direction of the substrate, FIG. 12B is an explanatory illustration showing a case where different light-shielding patterns are repeatedly printed in the longitudinal direction of the substrate, and FIG. 12C is an explanatory illustration showing a case where a plurality of light-shielding patterns lined as a group in the width direction of the substrate are repeatedly printed on the longitudinal direction of the substrate;

FIGS. 13A and 13B show illustrations of another example of the exposure device used for manufacturing the microlouver according to the fourth exemplary embodiment shown in FIG. 11, in which FIG. 13A is an explanatory illustration showing an example of the exposure device of a case where exposure processing is performed by setting the center region of the microlouver to be flat and FIG. 13B is an explanatory illustration showing an example of the exposure device of a case where exposure processing is performed by setting the center region of the microlouver to be in a concave shape;

DETAILED DESCRIPTION OF THE EXEMPLARY EMBODIMENTS (First Exemplary Embodiment)

Hereinafter, a first exemplary embodiment according to an optical element and its manufacturing method of the present invention will be described by referring to FIG. 1-FIG. 7.

Basic structures of the optical element according to the present invention will be described first, and specific contents thereof will be described thereafter.

Figure 1A:
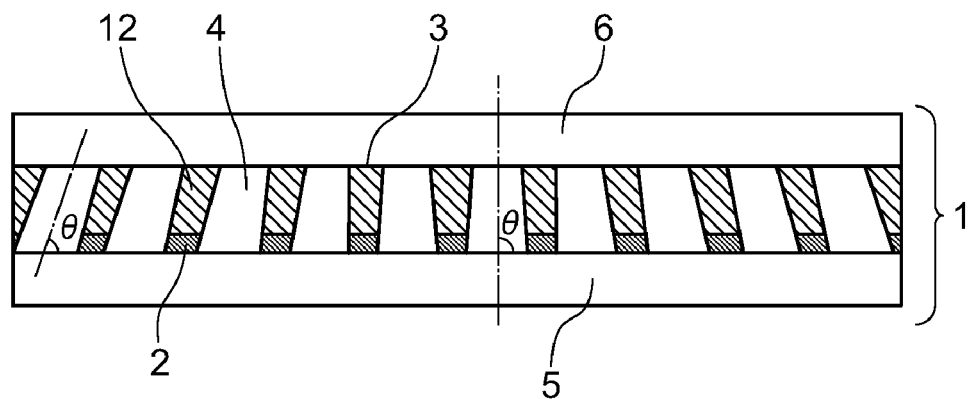

FIG. 1A is a schematic sectional view showing a sectional shape in the thickness direction of a microlouver (optical element) 1 that is manufactured based on a microlouver (optical element) manufacturing method according to the first exemplary embodiment of the present invention.

Referring to FIG. 1A, transparent layers 4 arranged in matrix within a same plane on a transparent substrate 5 and light absorption layers 3 in a pattern sectioning each of the transparent layers 4 are provided, and the light absorption layer 3 part is configured with two layers of a black curable resin 12 and a light-shielding pattern 2. Among those, interfaces between the transparent layers 4 and the light absorption layers 3 are set to be upright at 90 degrees with respect to the surface of the transparent substrate 5 in a center region of the transparent substrate 5, and at least a part of a peripheral region surrounding the center region is set to be in a state tilted towards the center region.

The tilt angle of the interface between the transparent layer 4 and the light absorption layer 3 with respect to the plane of the transparent substrate 5 is set to become larger towards the peripheral part from the center region of the optical element.

Thereby, when the viewpoint is located in the center region of the transparent layer 5, it is possible to secure the same brightness in the transmission light from the periphery as that of the transmission light from the center region.

Regarding the sectional shape of the transparent layer 4, the width in the top end thereof is set to be narrower than the width on the surface side of the transparent substrate 5 as the base end side. Further, a plurality of the interfaces formed between the transparent layers 4 and the light absorption layers 3 may be structured to include those that are built not in parallel to each other.

This will be described in more details.

In FIG. 1A, as described above, the microlouver (optical element) 1 includes the transparent substrate 5. This transparent substrate 5 is made with a polymer resin, and PET (Poly Ethylene Terephthalate) material or PC (Poly Carbonate) material is used as the material thereof. Prescribed light-shielding patterns 2 are formed on one of surfaces of the transparent substrate 5. In the first exemplary embodiment, a metal material such as aluminum is used as the structural material of the light-shielding patterns 2. However, a black resin may be used to form the light-shielding patterns 2. In the first exemplary embodiment, the light-shielding pattern 2 with the forming region of 26 inches diagonally (aspect ratio of 3:4) is used.

Figure 1B:
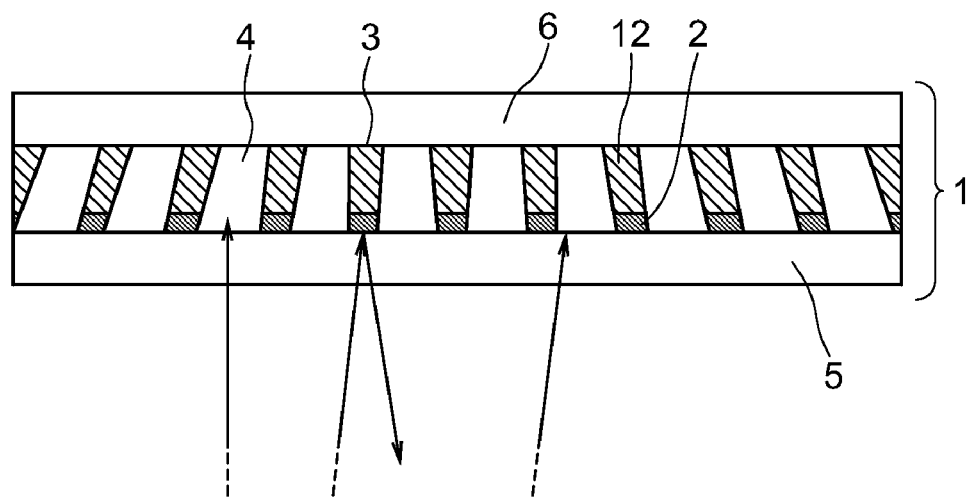

FIG. 1B shows an example of a case where the light-shielding pattern 2 is formed with a metal material such as aluminum. In the case of FIG. 1B, light from a backlight is reflected at a metal surface, and the reflected light is further reflected on the light source side to make incident on the microlouver 1 again. Thus, it is possible to acquire a light recycle effect with which the light becomes brighter than a case where the light is not reflected at the light-shielding patterns 2.

The light absorption layers 3 are formed on the light-shielding patterns 2 in FIG. 1A of the transparent substrate 5, and the transparent layers 4 are provided between each of the light absorption layers 3. Therefore, the light absorption layers 3 and the transparent layers 4 are set to coexist in an orderly manner on the transparent layer 5.

Further, a transparent layer 6 is attached on the top face (surface) of the transparent layers 4 and the light absorption layers 3 of FIG. 1A. As the shape of the transparent layer 4, it is appropriate to have a range of 30 µm to 300 µm in height (thickness), and that of 120 µm is used in the first exemplary embodiment. As the width of the transparent layer 4, it is preferable to have a range of 5 µm to 150 µm on the surface of the transparent substrate 5, and it is set to 40 µm in the first exemplary embodiment. Further, as the width of the light absorption layer 3, it is appropriate to have a range of 1 µm to 30 µm on the surface of the transparent substrate 5, and it is set to 10 µm in the first exemplary embodiment.

Furthermore, the shape on the top-end side (upper side in FIG. 1A) of the transparent layer 4 is formed narrower than the transparent substrate 5 side by about 10 µm. In the meantime, the shape of the light absorption layer 3 on the top-end side is wider because the transparent layer 4 is formed narrower. As shown in FIG. 2A and FIG. 2B, in a case where the film thickness t of the transparent layer 4 is the same, the light distribution property becomes improved when the top-end shape is formed narrower. The light absorption layer on the emission side becomes thicker, when the top-end shape of the light absorption layer 3 is formed wider. Thus, light leakages and the like hardly occur, so that the light shielding performance is improved.

Further, as shown in FIG. 1A, each of the transparent layers 4 and the light absorption layers 3 is formed as the pattern that is provided almost in a perpendicular direction with respect to the surface of the transparent substrate 5 at an angle θ of about 90 degrees (upright) with respect to the surface of the transparent substrate 5 in the center region of the transparent substrate 5. In the meantime, the angle θ becomes smaller towards the peripheral part of the substrate (in a direction away from the center region). Thus, on the outermost side of the light-shielding pattern forming region, it is in the above-described pattern that is tilted towards the center region at an angle of 66 degrees with respect to the surface of the transparent substrate 5.

Figure 3:
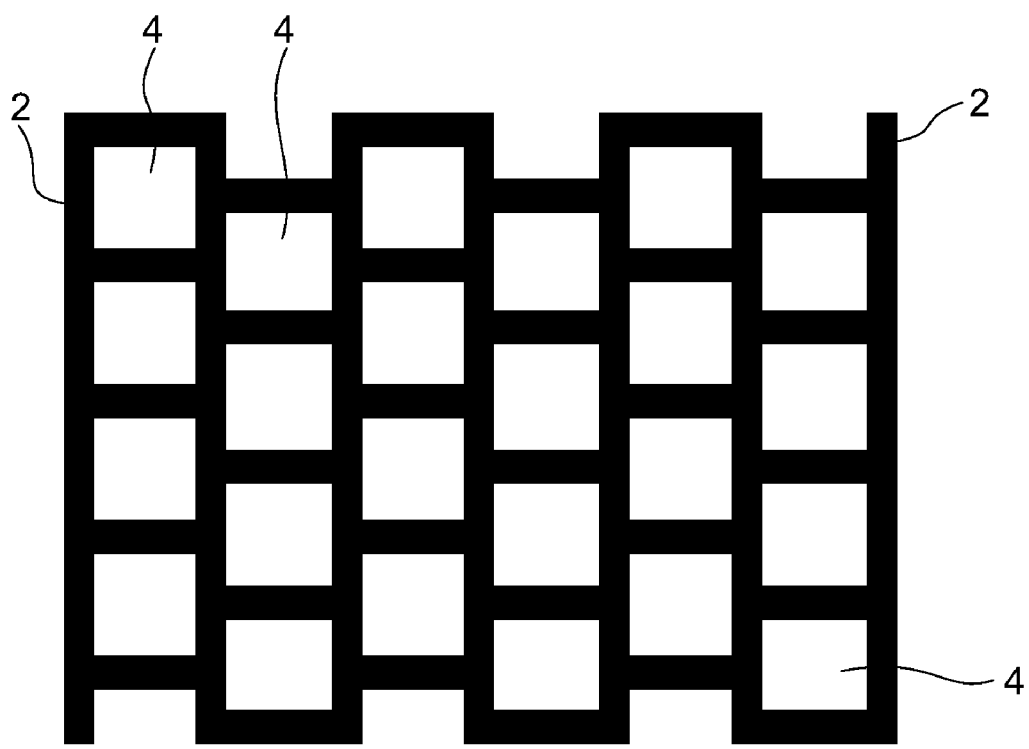
FIG. 3 is an explanatory illustration showing a plan pattern of a light-shielding pattern configured with the transparent layer and a light absorption layer of the microlouver shown in FIG. 1.

In the example shown in FIG. 1A, the sections of the transparent layers 4 and the light absorption layers 3 are arranged alternately in the lateral direction of FIG. 1A. In practice, the transparent layers 4 and the light absorption layers 3 are formed to have a prescribed plane pattern such as a grating as shown in FIG. 3.

The microlouver 1 is designed to be used to guide the light to make incident on the surface (bottom-side surface in FIG. 1A) which is on the opposite side of the above-described transparent substrate 5 where the transparent layers 4 and the light absorption layers 3 are formed, and the visible angle from the front of the substrate in the center part of the substrate is set to be about ±16 degrees with respect to a normal of the substrate surface.

Figure 4:
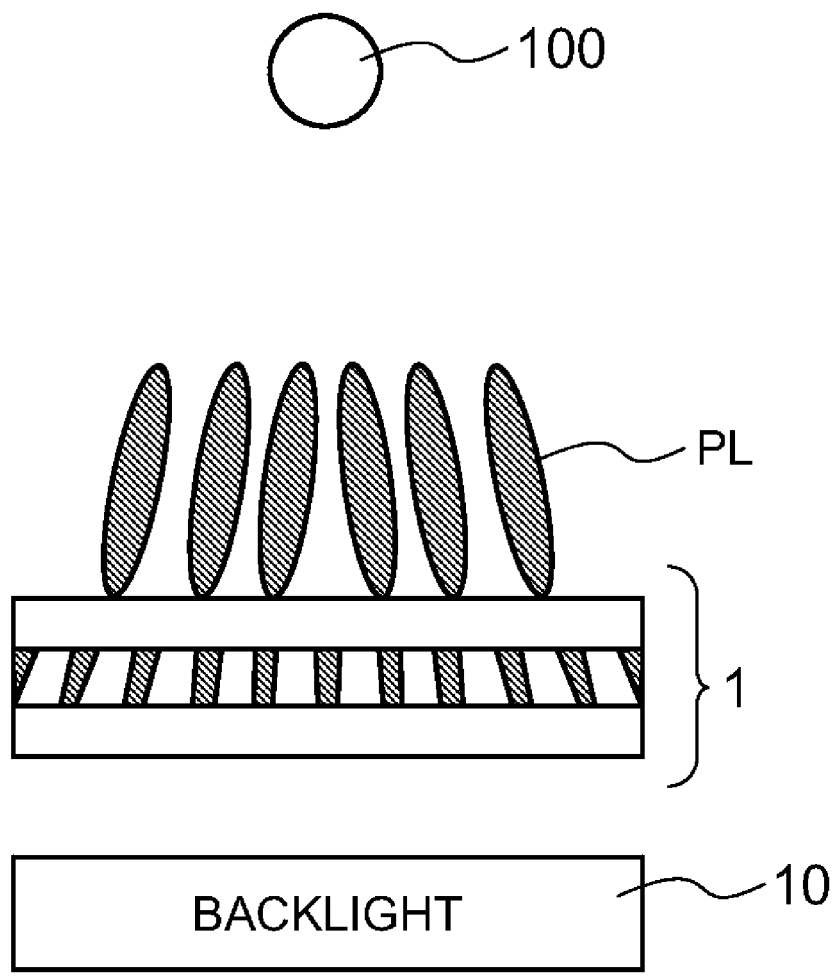
FIG. 4 is an explanatory illustration showing the light distribution property of transmission light from a backlight in a case where the microlouver disclosed in FIG. 1 is used.

Next, the light distribution property of the transmission light from the backlight will be described in a case where the microlouver 1 of the first exemplary embodiment is used. FIG. 4 shows the conceptual illustration.

First, the microlouver 1 is disposed on the front face (on the right side of FIG. 4) of a backlight 10. Transmission light PL emitted from the backlight 10 and transmitted through the microlouver 1 is converged onto an observer 100.

In that case, assuming that the microlouver 1 of the first exemplary embodiment is applied to a large-scaled display of 26 inches diagonally (aspect ratio of 3:4), for example, it is possible for the observer 100 at a distance of 60 cm from the screen to observe an image clearly not only in the center part of the display but also in the peripheral part of the display according to an approximate computation based on the tilt of 66 degrees of the transparent layers 4 and the light absorption layers 3 described above.

(Explanations of Manufacturing Method)

Next, an example of the manufacturing method of the microlouver 1 that is an optical element of the first exemplary embodiment will be described by referring to FIG. 5.

A basic execution procedure of the manufacturing method of the optical element will be described first, and it will be described more specifically thereafter.

Figure 5A:
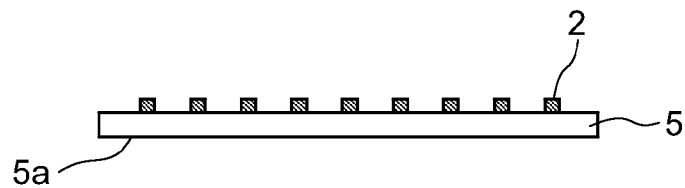
FIG. 5 is an explanatory illustration showing the procedure of the microlouver manufacturing method disclosed in FIG. 1.
Figure 5B:
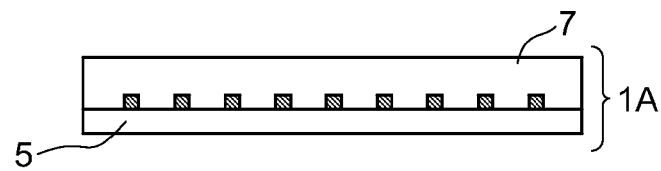
Figure 5C:
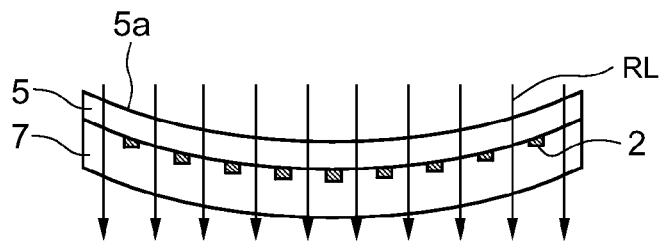
Figure 5D:
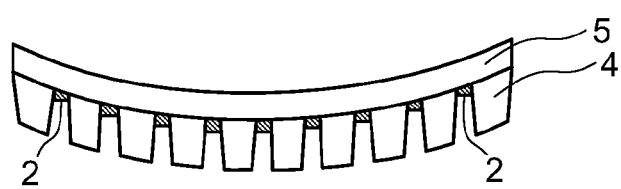

First, as the basic procedure, the manufacturing method includes: a transparent photosensitive resin laminating step of FIG. 5A that is a step which forms the light-shielding patterns 2 on the surface and FIG. 5B which laminates a transparent photosensitive resin layer 7 on the transparent substrate 5; a substrate bending/holding step which bends and holds the entire part (or at least a part) of the transparent substrate 5 on which the transparent photosensitive resin layer 7 is laminated; and a transparent layer forming step of FIG. 5C and FIG. 5D, which irradiates exposure light constituted with parallel light to the transparent photosensitive resin layer 7 via the transparent substrate 5 from the transparent substrate 5 side while the entire part (or at least a part) of the transparent substrate 5 is being bent to pattern the transparent photosensitive resin layer 7 so as to form the transparent layers 4.

Note here that bending of the transparent substrate 5 may be done in a part (at least a part) of the end region thereof, for example, or may be done in the entire peripheral part except the center region of the transparent substrate 5.

Figure 5E:
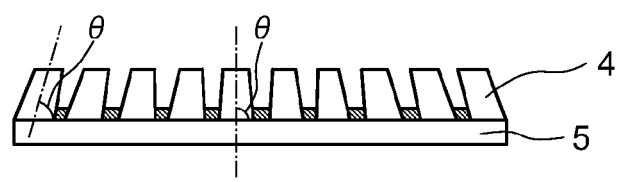
Figure 5F:
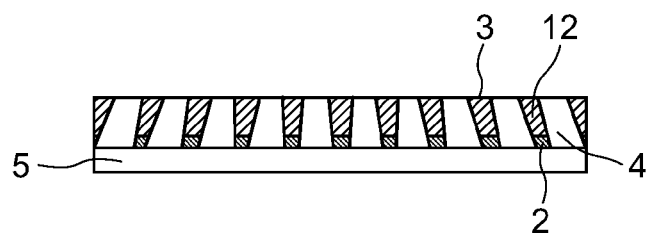

Further, the manufacturing method includes: a transparent substrate flat placing step of FIG. 5E, which sets the bent transparent substrate 5 by re-inverting it to be in an originally flat-surface state (in the same facing direction as that of FIG. 5B); and a light absorption layer forming step of FIG. 5F which fills a black curable resin 12 into spaces formed in the light-shielding part 2 located mutually between the transparent layers 4 formed by the patterning for forming a light absorption layer 3. The manufacturing method is structured to execute the above-described procedure sequentially. Subsequently, the transparent substrate 6 equivalent to the transparent substrate 5 described above is laminated on the top face (opposite-side face of the transparent substrate 5) of the light absorption layers 3 and the transparent layers 4. Thereby, the microlouver (optical element) 1 is completed.

In the substrate bending/holding step shown on FIG. 5B, the bent surface may be set by having a part (or the entire part) of the periphery of the transparent substrate 5 as described above. In that case, the bent surface that is being bent is characterized to be an arc continuous body that is raised from the surface of the transparent substrate 5.

Hereinafter, this will be described in more details.

As shown in FIG. 5A and FIG. 5B, first, the transparent photosensitive resin layer 7 is laminated on the transparent substrate 5 where the light-shielding patterns 2 are formed to form an optical element main body 1A thereby (steps S101, S102). The size of the forming region of the light-shielding patterns 2 herein is set as 26 inches diagonally (aspect ratio of 3:4).

As a laminating method of the transparent photosensitive resin layer 7, for example, a depositing method such as slit die coater, wire coater, applicator, dry film transfer, or spray application, is used. As the material of the transparent substrate 5 on which the light-shielding patterns 2 are formed, PET or PC is utilized.

In the first exemplary embodiment, chemical amplified photoresist (product name: SU-8) which is a product of Microchem Corp., is used as the material for the transparent photoresist resin layer 7. The transparent photosensitive resin layer 7 is an epoxy-based (specifically, glycidyl ether derivative of bisophenol A novolac) negative resist, with which a photoinitiator generates an acid when ultraviolet rays are irradiated and a curing monomer is polymerized by having the proton acid as a catalyst. Further, the transparent photosensitive resin layer 7 exhibits an extremely high transparent characteristic in a visible light region.

The molecule amount of the curing monomer contained in the transparent photosensitive resin layer 7 before being cured is relatively small, so that it is dissolved extremely well in solvents such as cyclopentanone, propylene glycol methyl ether acetate (PEGMEA), gamma butyl lactone (GBL), and isobuthyl ketone (MIBK). Thus, it is easy to form the thick film of the transparent photosensitive resin layer 7.

Further, the transparent photosensitive resin layer 7 exhibits an extremely fine light transmittance even for a wavelength of a near-ultraviolet region, so that it is characterized to transmit the ultraviolet rays even with the thick film. While the permissible range of the thickness of the transparent photosensitive resin layer 7 is defined to be within the range of 30 µm to 300 µm in the first exemplary embodiment, the thickness thereof is set as 120 µm in the first exemplary embodiment.

Further, since the transparent photosensitive resin layer 7 has such characteristic, it is possible to form a high aspect ratio pattern whose aspect ratio is 5 or more. Furthermore, there are many functional groups in the curing monomer, so that the transparent photosesnstive resin layer 7 after being cured becomes an extremely high-density cross linkage. Thus, it becomes extremely stable both thermally and chemically. Therefore, it is easy to process the transparent photosensitive resin layer 7 even after forming the patterns.

Note here that the material of the transparent photosensitive resin layer 7 is not limited only to the above-described transparent photosensitive resin (product name: SU-8). Any other photocuring materials may be used, as long as those have the same characteristic.

Then, as shown in FIG. 5C, the optical element main body 1A is first re-inverted to have the transparent substrate 5 on the upper side and to have the transparent photosensitive resin layer 7 facing downwards, and the optical element main body 1A is set to be in a bent state in a concave form. Thereafter, the transparent photosensitive resin layer 7 is patterned by using the light-shielding patterns 2 (step S103). The patterning step is executed by using the light-shielding patterns 2 formed in advance on the surface of the substrate instead of using a photomask that is known in a normal photolithography method.

In this case, the transparent photosensitive resin layer 7 and the light-shielding patterns 2 are completely fitted closely with each other. Therefore, it is possible to achieve stable resolution without having deterioration in the resolution, pattern variations, and the like caused by deterioration in the surface flatness due to the edge bead generated in the edge part of the application region of the transparent photosensitive resin layer 7 and variation in the film thickness within the application region.

Further, the light-shielding patterns 2 are in a grating pattern as shown in FIG. 3, and pitch widths thereof are set to be 50 µm, and light-shielding pattern widths are set to be 10 µm, respectively.

In the patterning step, specifically, the transparent substrate 5 is placed in such a manner that the back surface (the bottom surface of FIG. 5B) 5a of the above-described transparent substrate 5 is on the top side and the optical element main body 1A is set to be bent in a concave form from the upper side as shown in FIG. 5C to irradiate exposure light RL from the top face (the back face 5a side/concave face side of the transparent substrate 5) of FIG. 5C as shown with arrows.

In this case, the curvature shape is defined as a curved face with a radius curvature of 400 mm. The exposure light RL used at this time is parallel light. As a light source of the exposure light RL, an UV (Ultra Violet) light source is used in the first exemplary embodiment, and UV light with a wavelength of 365 nm is irradiated as the exposure light RL.

The exposure light RL irradiated from the light source is irradiated in a direction perpendicular to the substrate surface for the center part of the substrate back face 5a curved in a concave from. However, the irradiation angle is gradually tilted towards the outer periphery, and the light makes incident on the substrate surface at an angle of 66 degrees in the outermost periphery of the light-shielding pattern forming region.

The exposure light amount of the exposure light RL is set to be 350 mJ/cm$^2$ so that the top-end shape of the transparent layer 4 acquired by the pattern resolution becomes narrow. When the exposure amount is too small, the pattern is not resolved. In the meantime, when the exposure amount is too large, the shape becomes rectangular or the space between the neighboring patterns becomes narrow. Therefore, it is necessary to be cautious.

As shown in FIG. 6A, in a case where the sectional shape of the transparent layer 4 is a rectangular, there is a possibility of having a pattern fault that may be caused when the head parts of the neighboring patterns of the transparent layers 4 come in contact with each other in a process (see an arrow in the drawing) where a rinse solution w evaporates in rinse processing performed after development. However, in the first exemplary embodiment, as shown in FIG. 6B, the top end of the transparent layer 4 is formed narrower, so that the head parts of the neighboring patterns are isolated from each other.

Therefore, the possibility of having the pattern fault becomes lower during the process of evaporating the rinse solution w (see arrows in the drawing) and after the development.

Figure 7A:
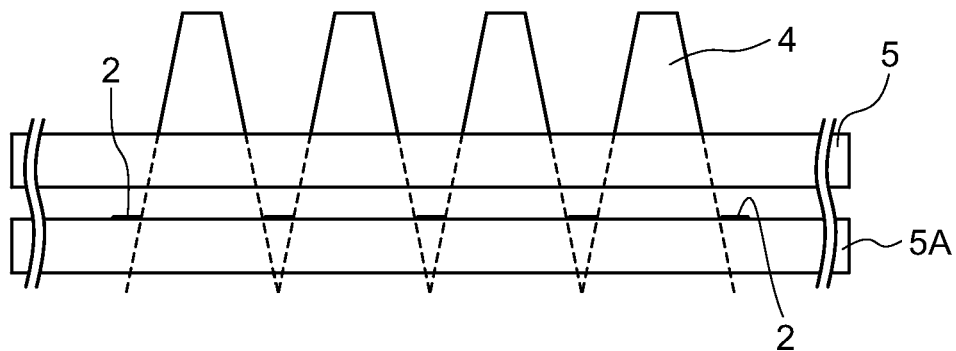
Figure 7B:
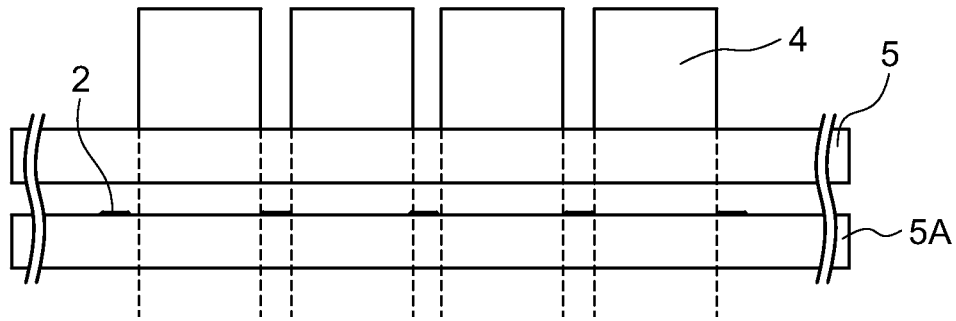

Further, separately from this, there is also considered a method of performing exposure from the substrate back face 5a by using a photomask as in a normal photolithography method. However, as in FIG. 7B, in a case where the sectional shape of the transparent layer 4 is a rectangular, the distance between a mask pattern 8, not shown, and the transparent layer 4 becomes isolated due to the thickness of the substrate. Thus, it is difficult to resolve the trapezoid patterns while keeping the spaces between the patterns of the light-shielding patterns as in the case of the first exemplary embodiment. In FIG. 7, reference numeral 5A shows a transparent holding substrate used for holding the mask pattern, which is made with a transparent member. Further, reference numeral 5 shows the transparent substrate.

Then, when exposure and development are executed in a state of FIG. 5C described above, the transparent layers 4 whose top-end shape is narrower than the substrate surface by about 10 μm is formed (see FIG. 5D: step S104). When the transparent substrate 5 is placed in a flat state thereafter, the transparent layer 4 at the angle θ with respect to the surface of the transparent substrate 5 of about 90 degrees is formed in the center part of the transparent substrate 5. However, the angle θ becomes narrower towards the periphery of the substrate, and the transparent layer 4 whose angle θ is 66 degrees with respect to the surface of the transparent substrate 5 and tilted in the direction towards the center of the substrate is formed on the outermost side of the light-shielding pattern forming region (see FIG. 5E: step S105).

Then, the black curable resin 12 to be the light absorption layer 3 is filled between each of the patterns of the patterned transparent layers 4, and the black curable resin 12 is cured thereafter to form the light absorption layers 3 (see FIG. 5F: step S106).

The curing method of the black curable resin varies depending on the black curable resin to be used. However, in general, heat annealing or UV irradiation is used. The first exemplary embodiment shows a case where UV irradiation with a light amount of 120 mJ/cm$^2$ is performed, and heat annealing is performed thereafter at 90 degrees Celsius for thirty minutes. The top end of the light absorption layer 3 formed thereby is wider for the amount by which the top end of the transparent layer 4 is formed narrower.

Figure 5G:
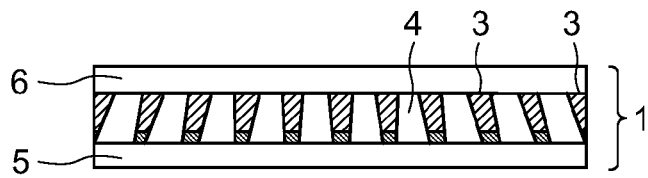

At last, a transparent substrate 6 is attached on the surface of the transparent photosensitive resin layer and the black curable resin to acquire the microlouver (optical element) (FIG. 5G: step S106).

Note here that the transparent substrate 6 may be attached on the transparent photosensitive resin layer and the black curable resin by being laminated thereon or may be attached on the transparent photosensitive resin layer and the black curable resin via a transparent adhesive layer.

Further, while the first exemplary embodiment shows an example (see FIG. 1) of the case where the pattern of the transparent layer 4 that is almost perpendicular to the surface of the transparent substrate 5 is formed in the center region of the transparent substrate 5 and the transparent layer 4 tilted to the inner side of the surface of the transparent substrate 5 is formed as going towards the periphery, the present invention is not limited only to such case. That is, the transparent substrate 5 may simply need to be bent in such a manner that the exposure light RL makes incident perpendicularly on the surface of the transparent photosensitive resin layer 7 corresponding to the position at which the light from the display is to be converged. Further, while the case where the height (thickness) of the transparent layer 4 is 120 μm, the pattern pitch width is 50 μm, and the width of the light absorption layer 3 is 10 μm is depicted in the first exemplary embodiment, the height (thickness) of the transparent layer 4, the pattern pitch width, and the width of the light absorption layer are not limited only to such values. For example, the same effects can be achieved in a case where the ratio of each size is the same as that of the first exemplary embodiment, e.g., the height (thickness) of the transparent layer 4 is 60 μm, the pattern pitch width is 25 μm, and the width of the light absorption layer 3 is 5 μm.

As described above with the first exemplary embodiment, the exposure light RL of an arbitrary intensity makes incident on the transparent photosensitive resin layer 7 in an oblique direction via the light-shielding patterns 2 at least in a part of the transparent resin film. Thus, in this part, the transparent layer 4 having a wall face tilted with respect to the surface of the transparent substrate 5 is formed in the transparent photosensitive resin layer 7.

Through filling the black curable resin between each of the transparent layers 4, the light absorption layers 3 can be formed. The optical element 1 manufactured in this manner can be formed in various kinds of shapes easily. Further, it is possible to effectively prevent deteriorations in the resolution and pattern variation caused by deterioration in the surface flatness caused due to edge bead generated in the edge part of the application region of the transparent photosensitive resin and variation in the film thickness within the application region, and pattern variation caused due to shape fault of the Fresnel lens.

Thereby, the microlouver (optical element) 1 that converges light to a prescribed position can be acquired. Further, while the case of using the light-shielding patterns 2 in a size of 26 inches diagonally is presented as a way of example in the first exemplary embodiment, the present invention is not limited only to such case. That is, light-shielding patterns 2 fitted to a prescribed display size may be used, and the substrate may be bent at an angle with which the desired light distribution property can be acquired. With this, a microlouver that can make the light converged at a prescribed position in a display of a prescribed size can be acquired.

The present invention is structured in the manner described above. Thus, as an exemplary advantage according to the invention, it is possible to freely set the tilt of the transparent layer of the optical element at an arbitrary place of the optical element by using parallel exposure light without using a complicated optical system. This makes it possible to achieve various kinds of variations of light distribution property easily. Therefore, it is possible to manufacture the optical element without causing deterioration in the resolution and variation in the patterns due to deterioration in the surface flatness caused by edge bead generated in an edge part of the region to which the transparent photosensitive resin is applied and variation in the film thickness within the applied region. This makes it possible to provide the excellent optical element manufacturing method that is capable of increasing the functions of the optical element as well as improving the yield and reducing the cost, and to provide the optical element exposure device, the optical element, the lighting optical device, and the display device.

(Second Exemplary Embodiment)

Next, a second exemplary embodiment of the present invention will be described by referring to FIG. 8.

Note here that same reference numerals are used for same structural members as those of the first exemplary embodiment described above.

FIG. 8 is an illustration showing a manufacturing method of a microlouver (optical element) 21 according to the second exemplary embodiment. The optical element illustrated in FIG. 8G is the microlouver (optical element) 21 that is completed by the manufacturing method. As in the case of the microlouver (optical element) 1 of FIG. 1 described above, the optical element 21 according to the second exemplary embodiment includes transparent layers 4 and light absorption layers 3 alternately on a transparent substrate 5 within a same plane, and the light absorption layer 3 is formed with two layers of a black curable resin 12 and a light-shielding pattern 2. Furthermore, interfaces between the transparent layers 4 and the light absorption layers 3 of the optical element 21 are set to be upright at 90 degrees with respect to the surface of the transparent substrate 5 in a center region of the transparent substrate 5, and at least a part (the entire part of the surrounding region in the second exemplary embodiment) of a peripheral region surrounding the center region is set to be in a state tilted towards the outer side, respectively.

In this case, regarding the sectional shape of the light absorption layer 3, the width in the top end thereof is set to be wider than the width on the surface side of the transparent substrate 5 as the base end side. In the practical use, it is loaded by being inverted vertically so as to function in the same manner as the case of the first exemplary embodiment described above.

Hereinafter, this will be described in more details.

In the second exemplary embodiment, first, a transparent photosensitive resin layer 7 is formed on the transparent substrate 5 where the light-shielding patterns 2 are formed, as in the case of the first exemplary embodiment described above (see FIG. 8A and FIG. 8B: steps S201, S202). As the transparent photosensitive resin layer 7, chemical amplified photoresist (product name: SU-8) which is a product of Microchem Corp., is used as in the case of the first exemplary embodiment. For the thickness thereof, it is set to be within a range of 30 μm to 300 μm as in the case of the first exemplary embodiment. In particular, it is set as 120 μm in the second exemplary embodiment.

Note here that the transparent photosensitive resin used in the second exemplary embodiment is not limited to the transparent photosensitive resin (product name: SU-8) used in the above-described first exemplary embodiment. Any other photocuring materials may be used, as long as those have the same characteristic.

Subsequently, the transparent photosensitive resin layer 7 is patterned by using the light-shielding patterns 2 (see FIG. 8C: step S203). The light-shielding patterns 2 are the same as those of the first exemplary embodiment described above.

Figure 8A:
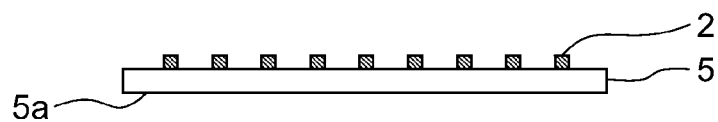
FIG. 8 shows sectional views of a microlouver manufacturing method according to a second exemplary embodiment of the present invention and a schematic structure of a microlouver manufactured by the manufacturing method.
Figure 8B:
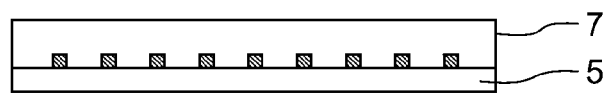
Figure 8C:
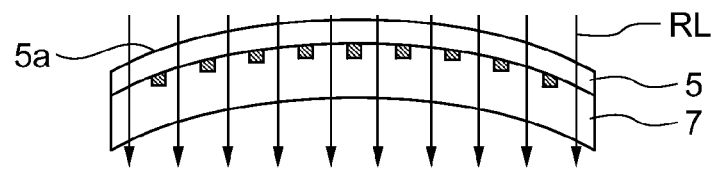

In a step of FIG. 8C, the substrate is set in such a manner that the substrate back face side 5a is bent in a convex form that is inverted from the case of the above-described first exemplary embodiment so that the exposure light RL makes incident on the surface of the substrate back face 5a. The curvature shape is defined as a curved face with a radius curvature of 400 mm. As the exposure light, parallel UV light with a wavelength of 365 nm is used at this time as in the case of the first exemplary embodiment.

The exposure light RL is irradiated in a direction perpendicular to the substrate surface for the center part of the substrate back face 5a curved in a convex form, as shown in FIG. 8C described above. However, the irradiation angle is gradually tilted towards the outer periphery, and the light makes incident on the substrate surface at an angle of 114 degrees (or approximately 114 degrees) in the outermost periphery of the light-shielding pattern forming region. Further, the exposure light amount of the exposure light at this time is set to be 350 mJ/cm² as in the case of the first exemplary embodiment.

Figure 8D:
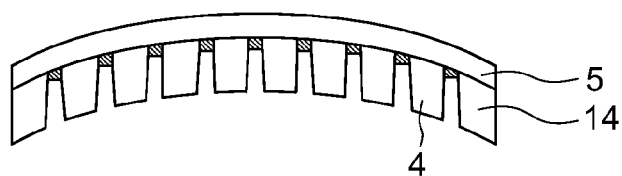
Figure 8E:
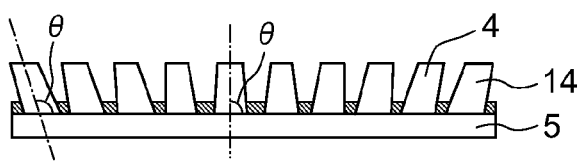
Figure 8F:
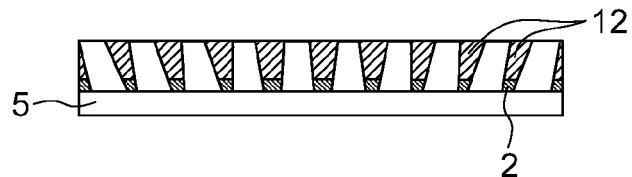
Figure 8G:
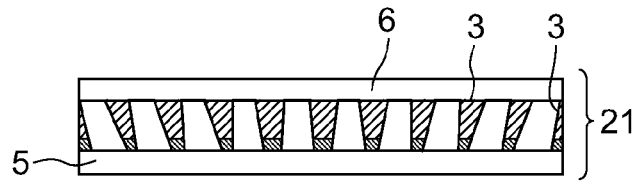

Then, when development is performed after performing exposure as in the case of the first exemplary embodiment described above, the transparent layers 4 whose top-end shape is narrower than the substrate surface by about 10 μm is formed (see FIG. 8D). When the transparent substrate 5 is placed in a flat state, the transparent layer 4 at the angle θ with respect to the surface of the transparent substrate 5 of about 90 degrees (upright) is formed in the center region of the transparent substrate 5. However, the angle θ becomes wider towards the periphery of the substrate, and the transparent layer 14 tilted in the direction towards the outer periphery of the substrate at the angle θ of 114 degrees with respect to the surface of the transparent substrate 5 is formed on the outermost side of the light-shielding pattern forming region (see FIG. 8E).

In the second exemplary embodiment, the head parts of the neighboring patterns of the transparent layers 4 are more distant than the case of the first exemplary embodiment. Therefore, a possibility of having a pattern fault that may be caused when the head parts of the neighboring patterns come in contact with each other can be decreased further when the rinse solution evaporates in the rinse processing performed after development.

Thereafter, the black curable resin 12 is filled between the transparent layers 4 and then the black curable resin 12 is cured to form the light absorption layers 3 as in the case of the first exemplary embodiment described above. In the second exemplary embodiment, the spaces between each of the transparent layers 4 for filling the black curable resin 12 are wider than the case of the first exemplary embodiment, so that filling unevenness is not likely to be generated when filling the black curable resin 12. At last, the transparent substrate 6 is attached on the transparent layers 14 and the light absorption layer 3 to acquire the microlouver 21 (see FIG. 8F and FIG. 8G).

The microlouver 21 is designed to be used by irradiating the light to the exposed surface of the transparent substrate 6. That is, while a part of the manufacturing method is different, the use method thereof is the same as that of the case of the first exemplary embodiment. The light distribution property of the transmission light from the backlight when the microlouver (optical element) of the second exemplary embodiment is used is the same as that of the first exemplary embodiment shown in FIG. 5, and the viewing angle in the center part of the substrate is about ±16 degrees.

Further, in the second exemplary embodiment, the light-shielding patterns are disposed on the light emission side. Thus, when the light-shielding patterns are formed with a metal material such as aluminum, the light-shielding patterns can be utilized as a minor. Therefore, it is possible to check the state of a person behind, thereby making it possible to improve the shielding effect for those who peep in obliquely by the reflection of the metal surface.

Other structures and operational effects thereof are the same as those of the first exemplary embodiment described above.

(Third Exemplary Embodiment)

Next, a third exemplary embodiment of the present invention will be described by referring to FIG. 9-FIG. 10.

Note here that same reference numerals are used for same structural elements as those of each of the first and second exemplary embodiments described above.

As in the case of the first exemplary embodiment described above, a microlouver (optical element) 31 according to the third exemplary embodiment includes transparent layers 16a or 16b and light absorption layers 3 alternately on a transparent substrate 5 within a same plane, and the light absorption layer 3 is formed with two layers of a black curable resin 12 and a light-shielding pattern 2.

Figure 10A:
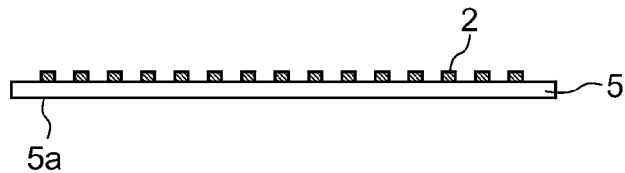
FIG. 10 shows explanatory illustrations showing a specific manufacturing procedure of the microlouver according to the third exemplary embodiment shown in FIG. 9.
Figure 10B:
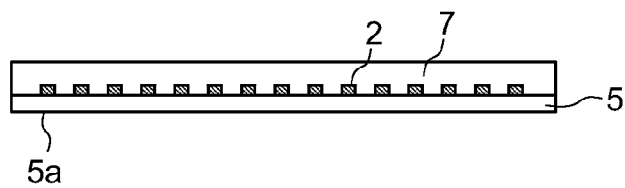
Figure 10C:
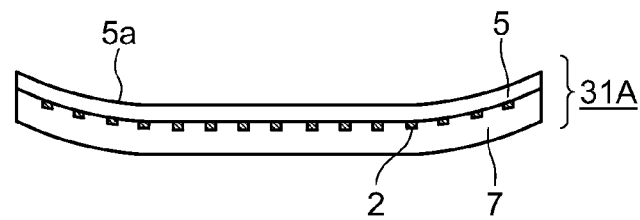
Figure 10D:
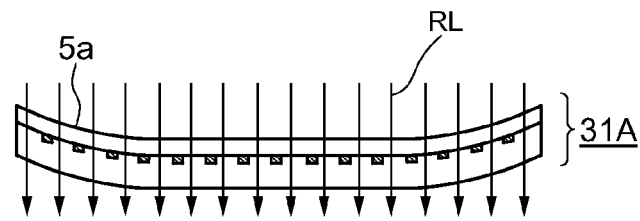
Figure 10E:
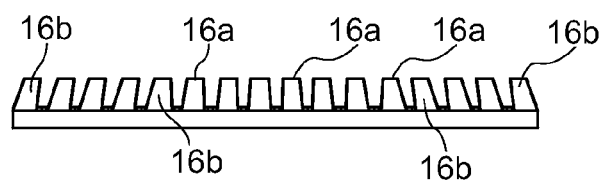
Figure 10F:
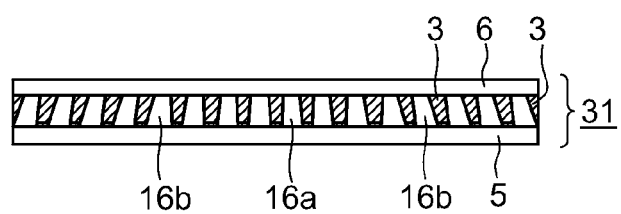

Furthermore, as shown in FIG. 10F, interfaces between the transparent layers 16a, 16b and the light absorption layers 3 are set to be upright at 90 degrees with respect to the surface of the transparent substrate 5 in a relatively wide region of a center region of the transparent substrate 5, and the entire part of four corners of the periphery surrounding the center region is set to be in a state tilted towards the center region. Note here that a part of the periphery surrounding the center region may be set to be in a state tilted towards the center region. With this, peeping from the sides cannot be done from the directions that are likely to be peeped, so that it is desirable.

Next, a manufacturing method of the optical element 31 according to the third exemplary embodiment will be described by referring to FIG. 10.

First, in the same manner as that of the first exemplary embodiment, a transparent photosensitive resin layer 7 is formed on the transparent substrate 5 where the light-shielding patterns are formed (see FIG. 10A and FIG. 10B). As the transparent photosensitive resin layer 7, chemical amplified photoresist (product name: SU-8) which is a product of Microchem Corp., is used as in the cases of each of the first and second exemplary embodiments. For the thickness thereof, it is set to be within a range of 30 μm to 300 μm as in the cases of each of the first and second exemplary embodiments. It is set as 120 μm in the third exemplary embodiment.

Note here that the transparent photosensitive resin 7 used in the third exemplary embodiment is not limited to the transparent photosensitive resin (product name: SU-8) used in each of the first and second exemplary embodiments. Any other photocuring materials may be used, as long as those have the same characteristic.

Subsequently, the transparent photosensitive resin layer 7 is patterned, assuming that the light-shielding patterns 2 are provided. The light-shielding patterns 2 are the same as those of each of the first and second exemplary embodiments.

Figure 9A:
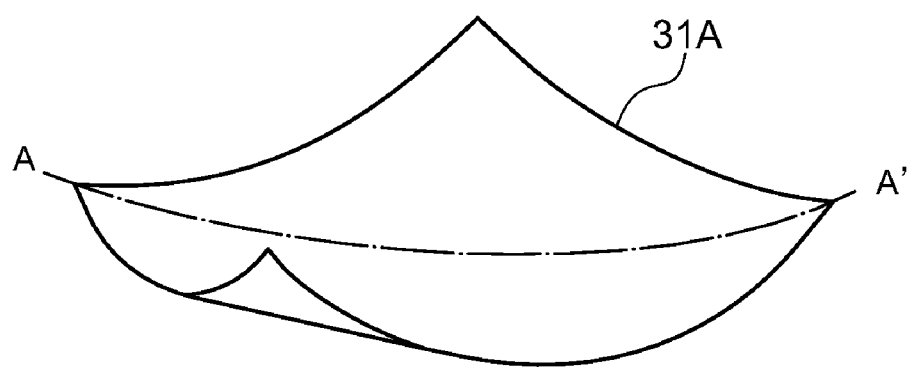
Figure 9B:
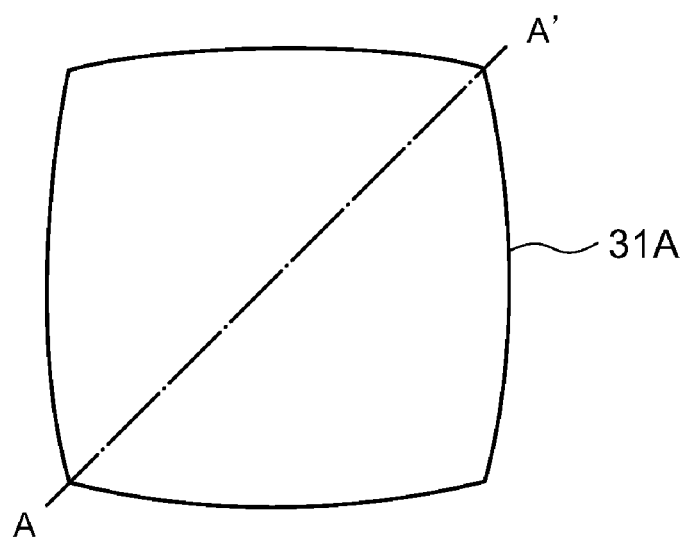

In this case, first, as shown in FIG. 9A and FIG. 9B, a back face 5a side of the square transparent substrate 5 is set to be bent in the four corners towards the center in a convex form (see FIGS. 10A, 10B and 10C). FIG. 10C shows a state where the four corners of the surface of the back face 5a of the transparent substrate 5 are set to be in a concave state after inverting the transparent substrate 5 on which the transparent photosensitive resin layer 7 is provided (a same state as that of FIG. 9B). Reference numeral 31A shows an optical element main body.

Then, the transparent substrate 5 is set to an exposure device or the like, not shown, in such a manner that the exposure light RL makes incident on the back face 5a of the transparent substrate 5 (see FIG. 10D). For the exposure light RL, parallel light is used as in the case of the first exemplary embodiment. The exposure light RL is irradiated in a perpendicular direction with respect to the flat part of the substrate back face 5a, so that it makes incident on the bent part of the substrate back face 5a obliquely.

When the transparent substrate 5 developed after being exposed is set to be in a flat state, the transparent layer 16a almost perpendicular to the plane of the transparent substrate 5 is formed in the transparent photosensitive resin layer 7 that is flat at the time of exposure, while the transparent layer 16b tilted towards the center region of the transparent substrate 5 is formed in the transparent photosensitive resin in a part that is bent in a concave form at the time of exposure (see FIG. 10E).

Thereafter, the light absorption layers 3 are formed between the transparent layers 16a and 16b as in the case of the first exemplary embodiment described above, and the transparent substrate 6 is attached on the transparent layers 4 and the light absorption layers 3 to acquire the microlouver 31 (see FIG. 10F).

Therefore, when the microlouver 31 according to the third exemplary embodiment is applied to a large-scaled display, not only the image in the center of the display but also the image in the vicinity of the four corners of the display can be observed clearly.

Other structures and operational effects thereof are the same as those of the first exemplary embodiment described above.

(Fourth Exemplary Embodiment)

Next, an optical element exposure device used for manufacturing the microlouvers (optical elements) according to the first to third exemplary embodiments described above will be described by referring to FIG. 11-FIG. 13.

Figure 11A:
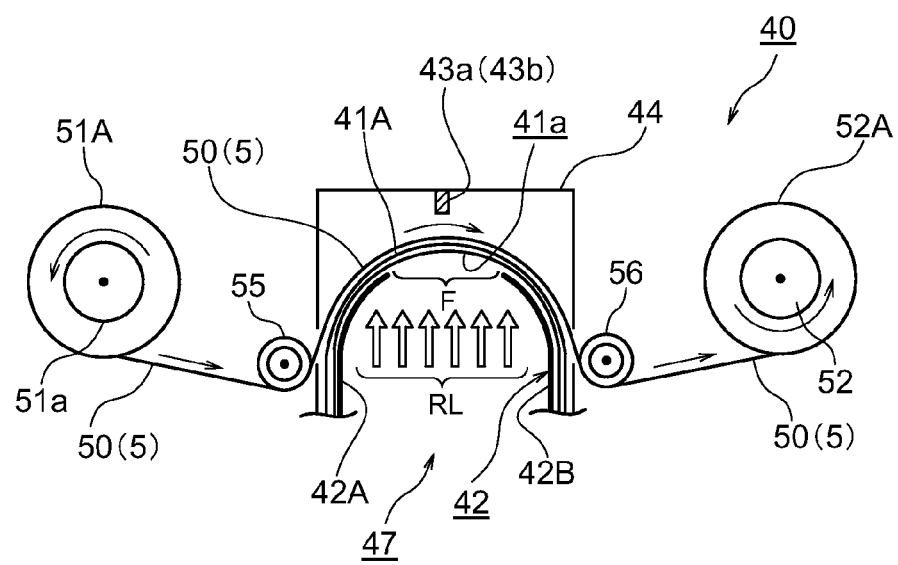
Figure 11B:
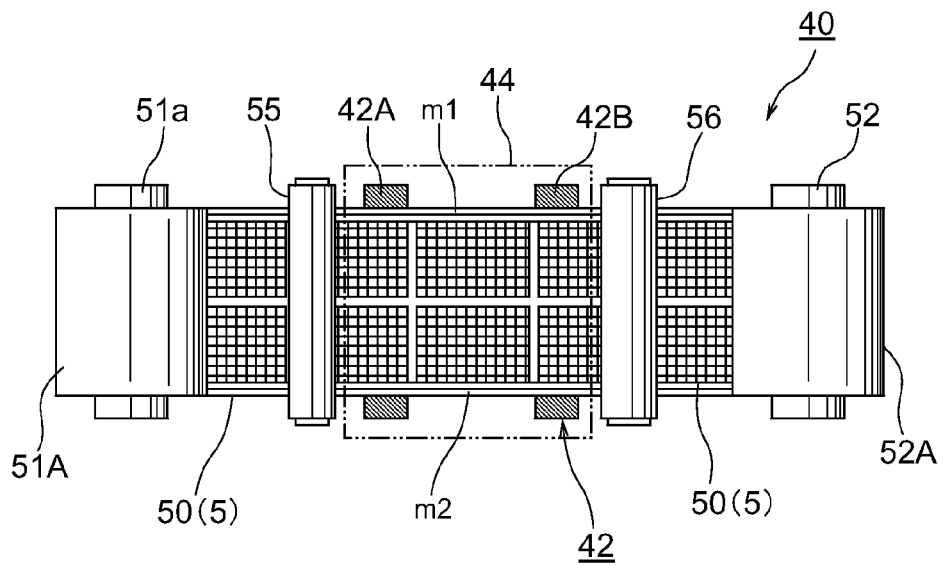
Figure 12A:
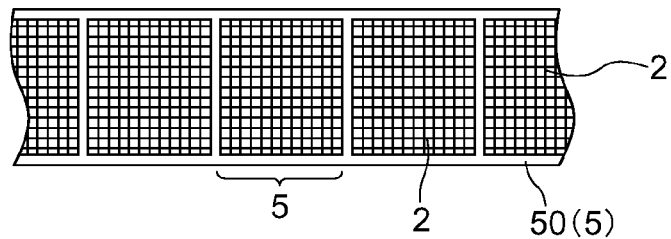
Figure 12B:
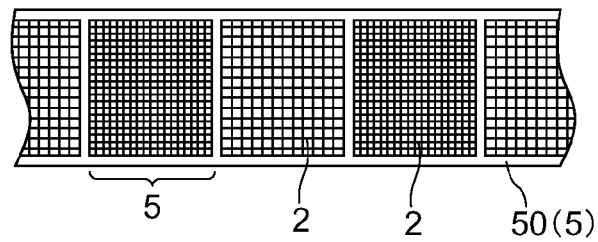
Figure 12C:
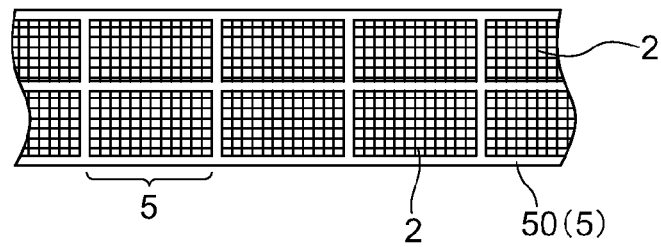

In FIG. 11A and FIG. 11B, an exposure device 40 used for optical elements is formed by a transparent material that can transmit the exposure light, and it includes: a stage face 41A for loading and holding the transparent substrate 5 having the transparent photosensitive resin layer 7 laminated on the outer face via the light-shielding patterns 2; a stage section 41a including the stage face 41A; an inner-face light-shielding structure 42 subjected to cover the entire surface of the stage face 41A except an exposure region F, which is provided on the inner-face side of the stage section 41a; position detection sensors 43a, 43b used for position alignment, which are provided on the top part of the stage face 41A with a prescribed interval therebetween by corresponding to alignment marks m1, m2 used for specifying the exposure position set in advance on the transparent photosensitive resin layer 7 on the transparent substrate 5.

Reference numeral 44 shows a sensor holding cover which holds the position detection sensors 43a and 43b at the center of the inner-face side. The sensor holding cover 44 used herein is in a structure that covers the entire part of the outer surface of the top part of the stage face 41A described above, and it is loaded to the stage section 41a to be freely detachable.

Regarding the stage section 41a described above, the top-end part is formed in a semicylindrical shape as a whole, and light-shielding sheets 42A, 42B targeted at the entire surface are provided to the inner-side wall face. Thereby, the entire inner face forms the inner-face light-shielding structure 42 described above.

As shown in FIG. 11A, an exposure light irradiation module 47 which irradiates the exposure light RL towards the transparent substrate 5 from the bottom side to perform patterning processing on the transparent photosensitive resin layer 7 is loaded inside the stage section 41a. When the position detection sensors 43a, 43b detect that it has come to the alignment marks m1, m2 used for position alignment described above, the exposure light irradiation module 47 starts an operation at the detection timing to irradiate prescribed exposure light to the transparent photosensitive resin layer 7 part of the transparent substrate 5 described above. Thereby, patterning is executed, and the transparent layers 4 described above are formed.

The surface structure of the stage face 41A of the stage section 41a described above is in a state bent in a convex form towards the upper part (the position detection sensor 43 side) of FIG. 11A as a whole. In the surface structure bent in a convex form, specifically, the entire part is formed in a semicylindrical shape.

Figure 13A:
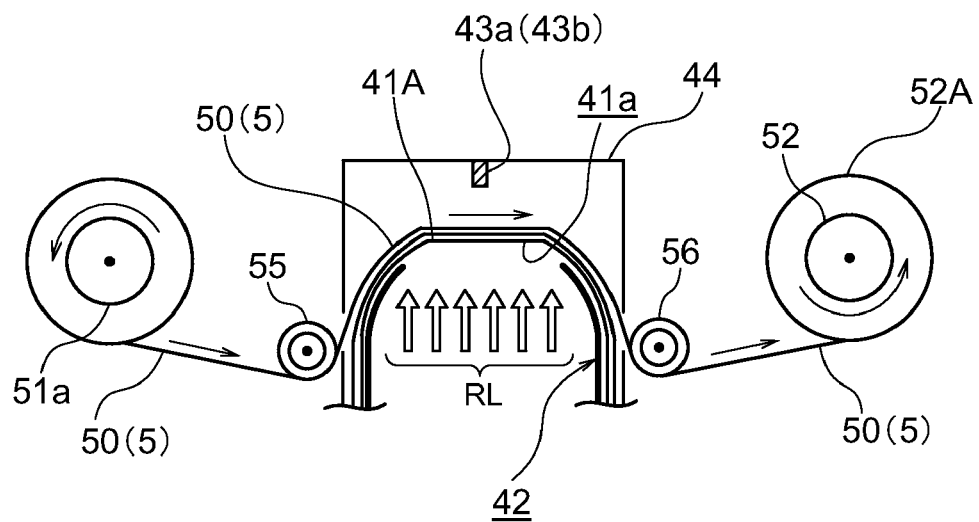

Note here that the stage face 41A may be formed in such a manner that the top-end region of the center part is flat and both ends on the left and right sides out of the periphery thereof form a part of the above-described semicylindrical shape, as shown in FIG. 13A.

Thereby, transmission of light equivalent to that of the center region can be acquired in the end part of the bent region, so that there is an advantage of acquiring a clear image in the end-part region.

Further, with the optical element exposure device 40 according to the fourth exemplary embodiment, the transparent substrate 5 on which the transparent photosensitive resin layer 7 as the target of irradiating the exposure light is laminated is formed as a belt-type transparent substrate 50 in which a plurality of the transparent substrates 5 are connected continuously in a belt form in advance.

The belt-type transparent substrate 50 is wound in a roll form around a transparent substrate feeding roller 51a to be provided on one of the side faces of the stage section 41a, and a take-up roller 52 that takes up the belt-type transparent substrate 50 after being subjected to the patterning processing is provided to the other side face of the stage section 41a.

Further, guiding rollers 51A, 51B for the belt-type transparent substrate are loaded, respectively, between the transparent substrate feeding roller 51a and the stage face 41A and between the stage face 41A and the take-up roller 52.

Hereinafter, this will be described in more details.

First, the light-shielding patterns 2 for forming the transparent layers 4 from the transparent photosensitive resin layer 7 by irradiating the exposure light RL will be described.

The light-shielding patterns 2 placed first on the transparent substrate 5 that configures each part of the belt-type transparent substrate 50 are in a pattern form that corresponds to an intended display size. There may be a case where the same light-shielding pattern 2 is formed in the longitudinal direction of the substrate as the forward direction of each of the transparent substrates 5, a case where a plurality of different light-shielding patterns are formed, or a case where a plurality of light-shielding patterns 2 lined as a group in the short-side direction of the transparent substrate 5 are formed sequentially in the longitudinal direction of the transparent substrate 5 (see FIG. 12A, FIG. 12B, and FIG. 12C).

Further, there may also be a case where two same light-shielding patterns lined as a group in the short-side direction of the transparent substrate 5 are formed sequentially in the longitudinal direction of the belt-type transparent substrate 50 in which the transparent substrates 5 are continuously connected. However, as each of the light-shielding patterns 2 of each of the transparent substrate 5 of the fourth exemplary embodiment, the same pattern as the case of the first exemplary embodiment described above is used.

As the transparent photosensitive resin layer 7, chemical amplified photoresist (product name: SU-8) which is a product of Microchem Corp., is used as in the cases of each of the first to third exemplary embodiments. For the thickness thereof, it is set to be within a range of 30 μm to 300 μm as in the cases of each of the first to third exemplary embodiments. It is set as 120 μm in the fourth exemplary embodiment.

Then, the belt-type transparent substrate 50 is set to the transparent substrate feeding roller (loader) 51a of the exposure device and a withdrawal roll 52A is also set to the take-up roller (unloader) 52 to feed the substrates continuously in a roll-to-roll manner. During that time, the stage face 41A bent to be fitted closely with the back face 5a of the transparent substrate 5 is designed to function with the transparent photosensitive resin layer 7 being on the surface side.

The stage face 41A is made with quartz so that UV light as the exposure light transmits therethrough, and the curvature shape is set to have a radius curvature of 400 mm in the fourth exemplary embodiment. Further, the stage face 41A is formed as a smooth minor face so that the contact face of the transparent substrate 5 is not damaged.

On the inner side of the bent stage section 41a, parallel UV light as the exposure light RL is irradiated from a light source, not shown. Further, as described above, the light-shielding sheets 45A and 45B for preventing sensitization in the areas other than arbitrary exposure region are provided between the bent stage and the light source.

When the belt-type transparent substrate 50 is fed at the same time with the start of the entire exposure device, first, position alignment on the stage face 41A is executed by recognizing the alignment marks m1, m2 which are formed on the transparent substrate 5 like the light-shielding patterns 2 by using the position detection sensors (optical sensors) 43a, 43b, and position alignment is executed in such a manner that the arbitrary exposure region is aligned with an aperture (i.e., the exposure light irradiation region) of a shutter. At this time, a positional relation in which the region intended to form a perpendicular pattern within the transparent substrate 5 comes on the uppermost part of the bent stage also is established at the same time.

Then, upon completing the position alignment, the exposure light RL is irradiated towards the transparent substrate 5 from the inside the stage section 41a. Thereby, exposure of the transparent photosensitive resin layer 7 on the transparent substrate 5 is completed. Exposure for the two light-shielding patterns can be done with one-time exposure processing. Through performing exposure while continuously feeding the substrates in a roll-to-roll manner as described above, the perpendicular pattern is formed in the center part of the light-shielding patterns 2, and the pattern becomes tilted to the substrate center direction as going towards the periphery of the light-shielding patterns so that the tilted pattern whose angle θ is 66 degrees with respect to the surface of the transparent substrate 5 is formed sequentially in both ends of the light-shielding patterns.

Thereafter, the light absorption layers 3 are formed between the transparent layers 4 as in the case of the first exemplary embodiment described above, and the transparent substrate 6 is attached on the transparent layers 4 and the light absorption layers 3 to acquire the optical element 1 that is the completed microlouver.

Figure 13B:
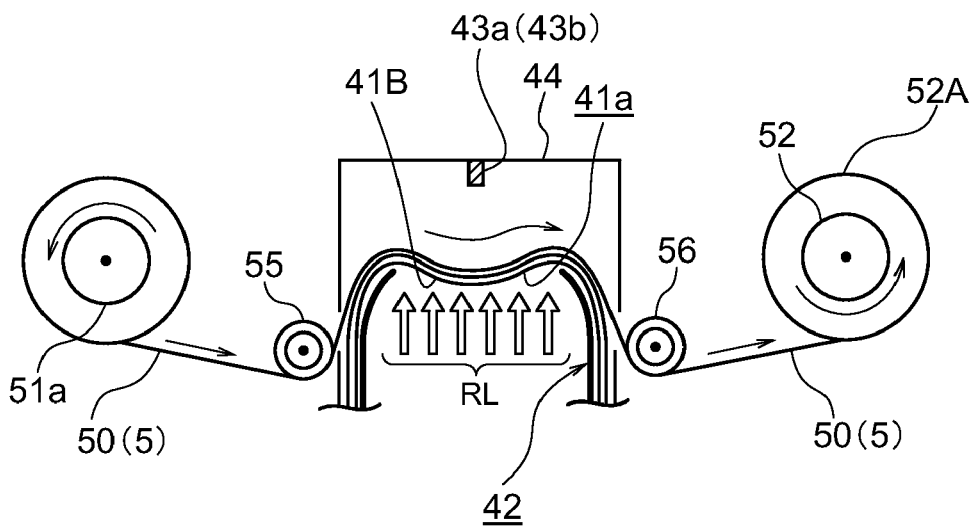

The shape of the stage face 41A of the stage section 41a is described as a semicylindrical (bent state in a convex form towards the upper side) surface structure as a whole. However, instead of the stage face 41A, a stage face 41B in a surface structure of a bent state in a convex form towards the bottom side (bent state with concave section as a whole when viewed from outside) as shown in FIG. 13B may also be employed.

In this case, the inside structure of the stage section 41a is formed as a tightly-sealed structure and a great number of air holes are provided in the stage face 41B, so that the inside is set to be in a negative-pressure state at the time of performing the exposure processing. Through this, the transparent substrate 5 or the belt-type transparent substrate 50 can be closely fitted to the concave bent face of the stage face 41B and keep the concave shape at the time of the exposure processing. In this regards, it is possible to securely acquire the optical element that is the microlouver disclosed in FIG. 8 (the second exemplary embodiment) described above.

(Fifth Exemplary Embodiment)

Next, a fifth exemplary embodiment of the present invention will be described by referring to FIG. 14.

Note here that same reference numerals are used for same structural members as those of the first to fourth exemplary embodiments described above.

FIG. 14 is an illustration showing a manufacturing method of a microlouver (optical element) 41 according to the fifth exemplary embodiment. The optical element illustrated in FIG. 14G is the microlouver (optical element) 41 that is completed by the manufacturing method.

The optical element 41 according to the fifth exemplary embodiment includes transparent layers 4 and light absorption layers 3 alternately on a transparent substrate 5 within a same plane, and the light absorption layer 3 is formed with a single layer of a black curable resin 12. Furthermore, interfaces between the transparent layers 4 and the light absorption layers 3 of the optical element 41 are set to be upright at 90 degrees with respect to the surface of the transparent substrate 5 in a center region of the transparent substrate 5, and at least a part (the entire part of the surrounding region in the fifth exemplary embodiment) of a peripheral region surrounding the center region is set to be in a state tilted towards the outer side, respectively.

With this, peeping from the sides cannot be done from the directions that are likely to be peeped, so that it is desirable.

Hereinafter, this will be described in more details.

Next, a manufacturing method of the optical element 41 according to the fifth exemplary embodiment will be described by referring to FIG. 14.

In the fifth exemplary embodiment shown in FIG. 14, a transparent photosensitive resin layer 7 is formed on the transparent substrate 5 where the light-shielding patterns and the like are not formed unlike the cases of the first to fourth exemplary embodiments described above (see FIG. 14A). As the transparent photosensitive resin layer 7, chemical amplified photoresist (product name: SU-8) which is a product of Microchem Corp., is used as in the case of the first exemplary embodiment. For the thickness thereof, it is set to be within a range of 30 μm to 300 μm as in the cases of the first to fourth exemplary embodiments. In particular, it is set as 120 μm in the fifth exemplary embodiment.

Note here that the transparent photosensitive resin used in the fifth exemplary embodiment is not limited to the transparent photosensitive resin (product name: SU-8) used in the above-described first exemplary embodiment. Any other photocuring materials may be used, as long as those have the same characteristic.

Subsequently, the transparent photosensitive resin layer 7 is patterned by using an exposure photomask 18 (see FIG. 14B and FIG. 14C). First, in a step of FIG. 14B, the light-shielding patterns 2 of the exposure photomask 18 are placed to be closely fitted to the surface of the transparent photosensitive resin layer 7. The pattern size of the light-shielding patterns 2 of the exposure photomask 18 is defined to be the same as that of the light-shielding patterns 2 formed on the transparent substrate 5 of the first to fourth exemplary embodiments described above. The light-shielding pattern width is set as 10 μm, and the pattern pitch is set as 50 μm. Further, the base material of the exposure photomask 18 is of a thin glass or a transparent resin such as PET or PEN (Poly Ethylene Naphthalate), and the entire exposure photomask can be bent in a concave form or convex form. For the exposure, the exposure device 40 (FIG. 11-FIG. 13) described in the fourth exemplary embodiment may be used. At this time, as described above, the transparent substrate 5 on which the light-shielding patterns 2 are not formed is used, and the exposure photomask 18 is used at the time of exposure.

Figure 14A:
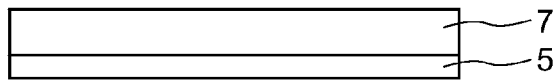
FIG. 14 shows sectional views of a microlouver manufacturing method according to a fifth exemplary embodiment of the present invention and a schematic structure of a microlouver manufactured by the manufacturing method.
Figure 14B:
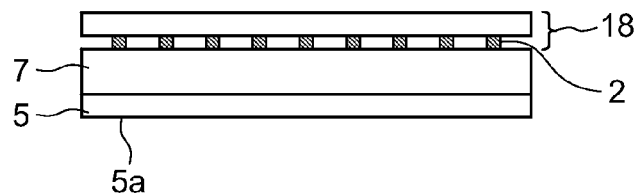
Figure 14C:
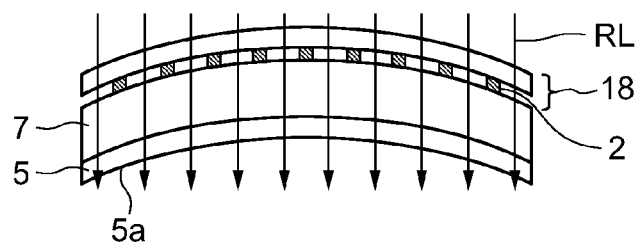

Then, in a step of FIG. 14C, the substrate is set in such a manner that the back face of the exposure photomask 18 is bent in a convex form so that the exposure light RL makes incident on the back face of the exposure photomask 18. The curvature shape is defined as a curved face with a radius curvature of 400 mm. As the exposure light, parallel UV light with a wavelength of 365 nm is used at this time as in the cases of the first to fourth exemplary embodiments.

The exposure light RL is irradiated in a direction perpendicular to the back face of the exposure photomask 18 bent in a convex form and to the center part of the substrate of the transparent photosensitive resin layer 7 as shown in FIG. 14C described above. However, the irradiation angle becomes gradually tilted in the region located in the outer periphery, and the light makes incident on the back face of the exposure photomask 18 and the surface of the transparent photosensitive resin layer 7 at an angle of 114 degrees (or approximately 114 degrees) in the outermost periphery of the light-shielding pattern forming region. Further, the exposure light amount of the exposure light RL at this time needs to be set to be stronger than the cases of the first to fourth exemplary embodiments by considering attenuation occurred when the exposure light passes through the exposure photomask 18. Specifically, it is defined as 400 mJ/cm$^2$ (or approximately 400 mJ/cm$^2$).

Figure 14D:
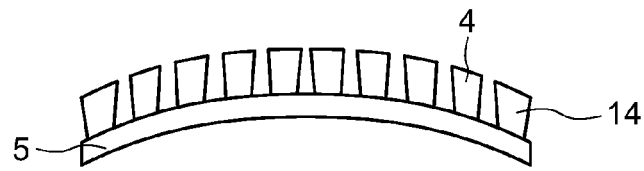
Figure 14E:
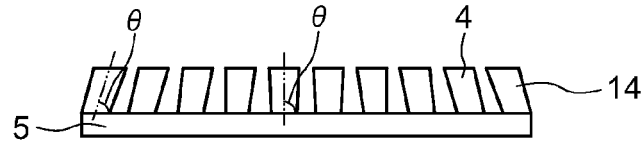
Figure 14F:
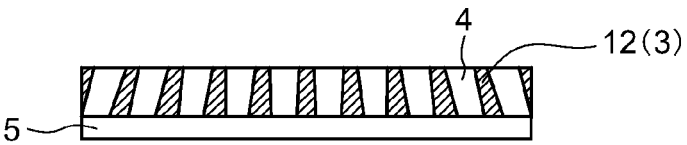
Figure 14G:
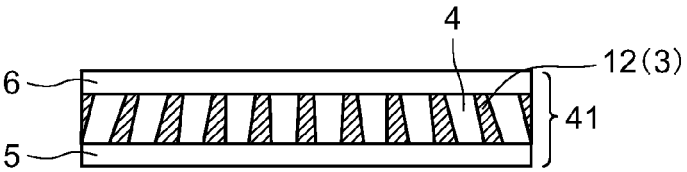

Then, when development is performed after performing exposure as in the cases of the first to fourth exemplary embodiments described above, the transparent layers 4 are formed (see FIG. 14D). When the transparent substrate 5 is placed in a flat state, the transparent layer 4 at the angle θ with respect to the surface of the transparent substrate 5 of about 90 degrees (upright) is formed in the center region of the transparent substrate 5. However, the angle θ becomes wider towards the periphery of the substrate, and the transparent layers 14 tilted in the direction towards the outer periphery of the substrate at the angle θ of 114 degrees with respect to the surface of the transparent substrate 5 are formed on the outermost side of the light-shielding pattern forming region (see FIG. 14E).

With the fifth exemplary embodiment, it is unnecessary to form the light-shielding patterns on the transparent substrate 5. This makes it possible to shorten the steps, so that the cost can be reduced and the yield can be improved.

Thereafter, the black curable resin 12 is filled between the transparent layers 4 and then the black curable resin 12 is cured to form the light absorption layers 3 as in the case of the first exemplary embodiment described above. At last, the transparent substrate 6 is attached on the transparent layers 14 and the light absorption layer 3 to acquire the microlouver 41 (see FIG. 14F and FIG. 14G).

The microlouver 41 is designed to be used by irradiating the light to the exposed surface of the transparent substrate 5. That is, while a part of the manufacturing method is different, the use method thereof is the same as that of the cases of the first to fourth exemplary embodiments.

The light distribution property of the transmission light from the backlight when the microlouver (optical element) of the fifth exemplary embodiment is the same as that of the first exemplary embodiment shown in FIG. 5.

Further, while the case where the height (thickness) of the transparent layer 4 is 120 μm, the pattern pitch width is 50 μm, and the width of the light absorption layer 3 is 10 μm is depicted in the fifth exemplary embodiment, the height (thickness) of the transparent layer 4, the pattern pitch width, and the width of the light absorption layer are not limited only to such values. For example, the same effects can be achieved in a case where the ratio of each size is the same as that of the first exemplary embodiment, e.g., the height (thickness) of the transparent layer 4 is 60 μm, the pattern pitch width is 25 μm, and the width of the light absorption layer 3 is 5 μm.

Other structures and operational effects thereof are the same as those of the first to fourth exemplary embodiments described above.

(Sixth Exemplary Embodiment)

Next, a sixth exemplary embodiment of the present invention will be described by referring to FIG. 15.

Note here that same reference numerals are used for same structural members as those of the first to fifth exemplary embodiments described above.

FIG. 15 is an illustration showing a manufacturing method of a microlouver (optical element) 51 according to the sixth exemplary embodiment. The optical element illustrated in FIG. 15E is the microlouver (optical element) 51 that is completed by the manufacturing method. As in the case of the exemplary embodiment shown in FIG. 14 described above, the optical element 51 according to the sixth exemplary embodiment includes transparent layers 4 and light absorption layers 3 alternately on a transparent substrate 5 within a same plane, and the light absorption layer 3 is formed with a single layer of a black curable resin 12.

Furthermore, interfaces between the transparent layers 4 and the light absorption layers 3 of the optical element 51 are set to be upright at 90 degrees with respect to the surface of the transparent substrate 5 in a center region of the transparent substrate 5, and at least a part (the entire part of the surrounding region in the sixth exemplary embodiment) of a peripheral region surrounding the center region is set to be in a state tilted towards the outer side, respectively.

In this case, regarding the sectional shape of the light absorption layer 3, the width in the top end thereof is set to be wider than the width on the surface side of the transparent substrate 5 as the base end side. In the practical use, it is loaded by being inverted vertically so as to function in the same manner as the case of the fifth exemplary embodiment described above.

Hereinafter, this will be described in more details.

As in the case of the fifth exemplary embodiment described above, in the sixth exemplary embodiment shown in FIG. 15, a transparent photosensitive resin layer 7 is formed on the transparent substrate 5 where the light-shielding patterns and the like are not formed (see FIG. 14A). For the thickness of the transparent photosensitive resin layer 7, it is also set to be within a range of 30 μm to 300 μm as in the cases of the first to fifth exemplary embodiments. In particular, it is set as 120 μm in the sixth exemplary embodiment.

Note here that the transparent photosensitive resin used in the sixth exemplary embodiment is not limited to the transparent photosensitive resin (product name: SU-8) used in the above-described first to fifth exemplary embodiments. Any other photocuring materials may be used, as long as those have the same characteristic.

Subsequently, the light-shielding patterns 2 of the exposure photomask 18 are placed to be closely fitted to the surface of the transparent photosensitive resin layer 7 (see FIG. 14B). The pattern size of the light-shielding patterns 2 of the exposure photomask 18 is defined to be the same as that of the light-shielding patterns 2 of the exposure photomask 18 of the fifth exemplary embodiment described above. Further, the base material of the exposure photomask 18 is defined to be the same as that of the fifth exemplary embodiment.

Figure 15A:
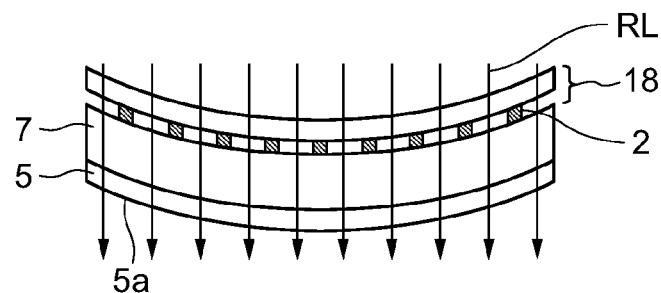
FIG. 15 shows sectional views of a microlouver manufacturing method according to a sixth exemplary embodiment of the present invention and a schematic structure of a microlouver manufactured by the manufacturing method.

Then, in a step of FIG. 15A, the substrate is set in such a manner that the back face of the exposure photomask 18 is bent in a concave form so that the exposure light RL makes incident on the back face of the exposure photomask 18. The curvature shape is defined as a curved face with a radius curvature of 400 mm. As the exposure light, parallel UV light with a wavelength of 365 nm is used at this time as in the cases of the first to fifth exemplary embodiments.

The exposure light RL is irradiated in a direction perpendicular to the back face of the exposure photomask 18 bent in a concave form and to the center part of the substrate of the transparent photosensitive resin layer 7 as shown in FIG. 14C described above. However, the irradiation angle becomes gradually tilted in the region located in the outer periphery, and the light makes incident on the back face of the exposure photomask 18 and the surface of the transparent photosensitive resin layer 7 at an angle of 114 degrees (or approximately 114 degrees) in the outermost periphery of the light-shielding pattern forming region. Further, the exposure light amount of the exposure light RL is defined as 400 mJ/cm$^2$ (or approximately 400 mJ/cm$^2$) as in the case of the fifth exemplary embodiment. For the exposure, the exposure device 40 (FIG. 11-FIG. 13) described in the fourth exemplary embodiment may be used. At this time, as described above, the transparent substrate 5 on which the light-shielding patterns 2 are not formed is used, and the exposure photomask 18 is used at the time of exposure.

Figure 15B:
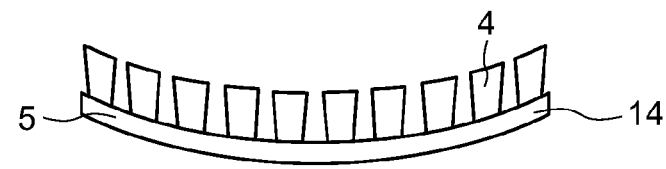
Figure 15C:
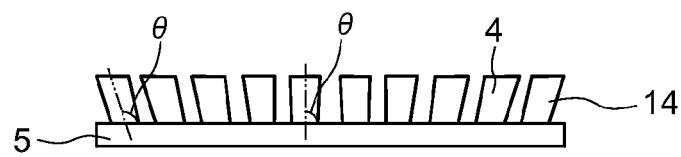
Figure 15D:
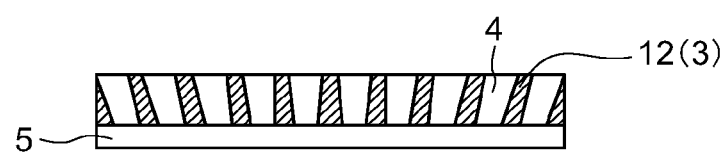
Figure 15E:
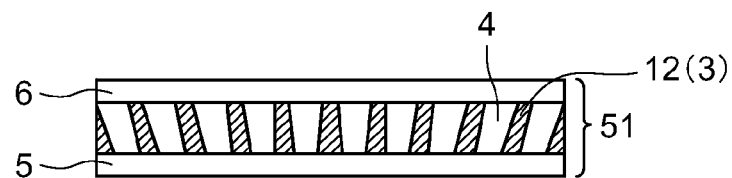

Then, when development is performed after performing exposure as in the cases of the first to fourth exemplary embodiments described above, the transparent layers 4 are formed (see FIG. 15B). When the transparent substrate 5 is placed in a flat state, the transparent layer 4 at the angle θ with respect to the surface of the transparent substrate 5 of about 90 degrees (upright) is formed in the center part of the transparent substrate 5. However, the angle θ becomes wider towards the periphery of the substrate, and the transparent layer 4 tilted in the direction towards the outer periphery of the substrate at the angle θ of 114 degrees with respect to the surface of the transparent substrate 5 is formed on the outermost side of the light-shielding pattern forming region (see FIG. 15C).

In the sixth exemplary embodiment, the head parts of the neighboring patterns of the transparent layers 4 are more distant than the case of the first exemplary embodiment. Therefore, a possibility of having a pattern fault that may be caused in the sixth exemplary embodiment when the head parts of the neighboring patterns of the transparent layers 4 come in contact with each other when the rinse solution evaporates in the rinse processing performed after development can be decreased further than the case of the fifth exemplary embodiment.

Thereafter, the black curable resin 12 is filled between the transparent layers 4 and then the black curable resin 12 is cured to form the light absorption layers 3 as in the cases of the first to fifth exemplary embodiments described above. In the sixth exemplary embodiment, the spaces between each of the transparent layers 4 for filling the black curable resin 12 are wider than the case of the fifth exemplary embodiment, so that filling unevenness is not likely to be generated when filling the black curable resin 12. At last, the transparent substrate 6 is attached on the transparent layers 14 and the light absorption layers 3 to acquire the microlouver 51 (see FIG. 15D and FIG. 15E).

The microlouver 51 is designed to be used by irradiating the light to the exposed surface of the transparent substrate 6. That is, while a part of the manufacturing method is different, the use method thereof is the same as that of the case of the fifth exemplary embodiment.

The light distribution property of the transmission light from the backlight when the microlouver (optical element) of the sixth exemplary embodiment is used is the same as that of the fifth exemplary embodiment shown in FIG. 14, and the viewing angle in the center part of the substrate is about ±30 degrees.

Further, in the sixth exemplary embodiment, the light-shielding patterns are disposed on the light emission side. Thus, when the light-shielding patterns are formed with a metal material such as aluminum, the light-shielding patterns can be utilized as a minor. Therefore, it is possible to check the state of a person behind, thereby making it possible to improve the shielding effect as well for those who peep in obliquely by the reflection of the metal surface.

Other structures and operational effects thereof are the same as those of the first to fifth exemplary embodiments described above.

(Other Exemplary Embodiments)

Regarding the optical elements (microlouvers) acquired in each of the first to third, fifth, and sixth exemplary embodiments described above, examples of the cases where those are loaded not only to a liquid crystal display device but also to other display devices having a display panel, such as various kinds of display devices and electronic apparatuses, will be described as other exemplary embodiments.

As the use forms of the microlouver (optical element) 1 according to the present invention, there may be considered various forms such as a form where the microlouver is loaded on a lighting display device that lights up a display panel, a form where it is directly laminated on the surface of a display panel, and a form where it is loaded inside a display device. Hereinafter, the structures of each of the use forms will be described in a specific manner. Note here that explanations will be provided by referring to a case of using the microlouver described in the first exemplary embodiment as the microlouver (optical element) 1.

(Display Device 1)

Figure 16:
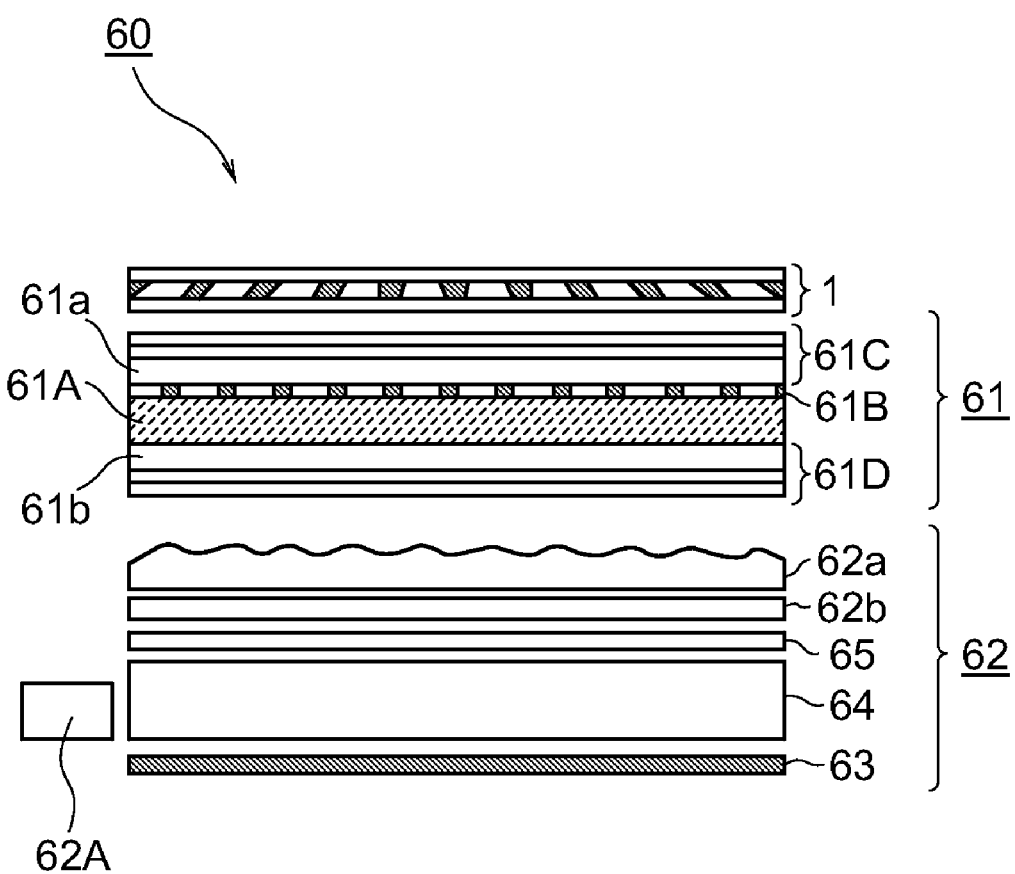
FIG. 16 is a sectional view showing an example of a display device of a case where the microlouver according to the present invention is loaded on a display screen.

First, in FIG. 16, a display device 60 is formed with the microlouver (optical element) 1 and a surface-type optical control element 61 as well as a lighting optical device 62 loaded on the back face of the microlouver (optical element) 1. In the case of FIG. 16, the microlouver 1 described above is used by being directly laminated to the surface of the display panel. As is clear in the first exemplary embodiment, the microlouver 1 has a light distribution property with which the light (inside light) from the optical control element 61 is converged towards the screen center direction.

The lighting optical device 62 loaded on the back face of the optical control element 61 is formed with a light source 62A such as a cold cathode tube, a reflection sheet 63, a light guide plate 64, a diffusion plate 65, and prism sheets 62a, 62b laminated sequentially from the bottom side of FIG. 16, and lights up the optical control element 61 with the light passing through the prism sheets 62a, 62b. The light source 62A is a surface light source.

The light guide plate 64 is made with an acryl resin or the like, and it is so structured that the light from the light source 62A makes incident on one of the end faces, and the incident light propagates within the light guide plate 64 and exits uniformly from the surface (prescribed side face). The reflection sheet 63 which reflects the light emitted from the back face towards the surface direction is provided on the back face side of the light guide plate 64. Although not shown, a reflection module is also provided on the other end face and side face of the light guide plate 64.

The light emitted from the surface of the light guide plate 64 makes incident on the optical control element 61 via the diffusion plate 65 and the prism sheets 62a, 62b. The diffusion plate 65 is used for diffusing the light that makes incident from the light guide plate 64. On the left end and right end of the light guide plate 64, the luminance of the emitted light is different due to its structure. Thus, the light from the light guide plate 64 is designed to be diffused by the diffusion plate 65.

The prism sheets 62a and 62b improve the luminance of the light that makes incident form the light guide plate 64 via the diffusion plate 65. The prism sheet 62a is formed with a plurality of prisms arranged in a specific direction at a specific interval. The prism sheet 62b is in a same structure. However, the orderly layout direction of the prisms therein is designed to cross with the orderly layout direction of the prisms of the prism sheet 62a. With the use of the prism sheets 62a and 62b, the directivity of the light diffused by the diffusion plate 65 can be increased.

While the fourth exemplary embodiment is described by referring to the case of using the cold cathode tube as the light source 62A, the light source is not limited only to that. A white LED, a tricolor LED, or the like may also be used as a light source. Further, while the fourth exemplary embodiment is described by referring to the case of using a side-light type light source, the light source is not limited only to that. A direct-type light source may also be used.

The optical control element 61 is in a structure in which a liquid crystal layer 61A is sandwiched between two substrates 61a and 61b. In the substrate 61a, a color filter 61B is formed on one of the surfaces (the surface on the liquid crystal layer 61A side), and a polarization plate/phase difference plate 61C is provided on the other surface. A polarization plate/phase difference plate 61D is provided on the surface opposite from the surface on the liquid crystal layer 61A side of the substrate 61b.

In the color filter 61B, color filters of R (red), G (green), and B (blue) are arranged in matrix in an orderly manner in a region that is sectioned by a black matrix made with a layer that absorbs light. Each color filter corresponds to a pixel, and the pitch thereof is constant. The liquid crystal layer 61A is structured to perform switching controls of a transparent state and a light-shielding state by pixel units arranged in an orderly manner according to a control signal from a control device, not shown. By switching the states, the light (incident light) fed from the above-described lighting optical device 62 is spatially modulated.

With the display device shown in FIG. 16, the light passing through the prism sheets 62b, 62a makes incident on the polarization plate/phase difference plate 61D. The light passing through the polarization plate/phase difference plate 61D makes incident on the liquid crystal layer 61A via the substrate 61b, and spatial modulation is performed therein by a pixel unit. The light (modulated light) passing through the liquid crystal layer 61A passes through the color filter 61B and the substrate 61a sequentially, and makes incident on the polarization plate/phase difference plate 61C. Then, the light passing through the polarization plate/phase difference plate 61C is emitted via the microlouver 1. In FIG. 16, the case of using the polarization plate/phase difference plate 61C and the polarization plate/phase difference plate 61D as the optical control element 61 is illustrated. However, the present invention is not limited only to such case, and the optical control element 61 may be formed only with a polarization plate.

With the display device 60 shown in FIG. 16, the light (modulated light) from the polarization plate/phase difference plate 61C is converged in the screen center direction by the microlouver 1. Thereby, the observer can finely observe even the image in the peripheral part of the screen. Note here that a hard coat layer for preventing scars and an antireflection layer for preventing external light captured therein may be formed on the surface of the microlouver 1.

When loading the microlouver 1, the microlouver 1 may be loaded to be freely detachable. In that case, it is possible to have the light distribution property with which the light is converged in the screen center direction by laminating the microlouver 1 to the optical control element 61, and to have the light distribution property with which the light is diffused onto the entire screen by detaching the microlouver 1 from the optical control element 61.

(Display Device 2)

Next, an example of a display device where the microlouver (optical element) 1 according to the present invention is loaded inside the device will be described by referring to FIG. 17. Note here that same reference numerals are applied for the same structural members as those of the display device 60 shown in FIG. 16 described above.

Figure 17:
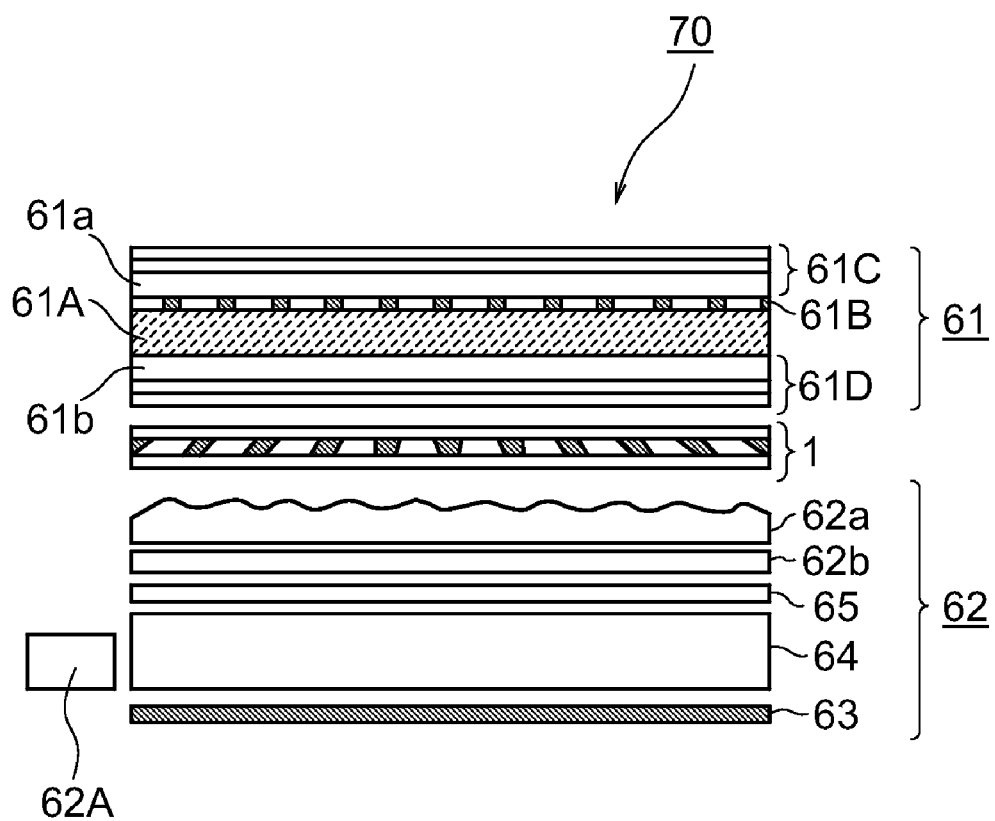
FIG. 17 is a sectional view showing an example of a display device of a case where the microlouver according to the present invention is loaded inside thereof.

In FIG. 17, a display device 70 is structured by including an optical control element 61, a lighting optical device 62 for lighting up the optical control element 61, and a microlouver (optical element) 1 that is provided between the lighting optical device 62 and the optical control element 61.

As described in the first exemplary embodiment, the microlouver 1 has the light distribution property with which the light (internal light) from the optical control element 61 is converged to the screen center direction. Further, unlike the case of "Display Device 1" described above, the microlouver 1 is interposed between the lighting optical device 62 and the optical control element 61 as shown in FIG. 17.

Each of the structures of the optical control element 61 and the lighting optical device 62 is the same as the case of "Display Device 1" shown in FIG. 17 described above.

With the display device 70 of this type, the light for lighting up the optical control element 61 is converged to the screen center direction by the microlouver (optical element) 1. Thus, the observer observing in the center of the screen can finely observe the image even in the peripheral part of the screen.

In that case, the microlouver 1 may be laminated to the polarization plate/phase difference plate 61D of the optical control element 61 via a transparent adhesive layer in the structure shown in FIG. 17. With this structure, a surface reflection loss in the interface between the microlouver 1 and the polarization plate/phase difference plate 61D can be decreased, so that lighting light of still higher luminance can be acquired.

(Example of Lighting Optical Device for Display Device)

Figure 18:
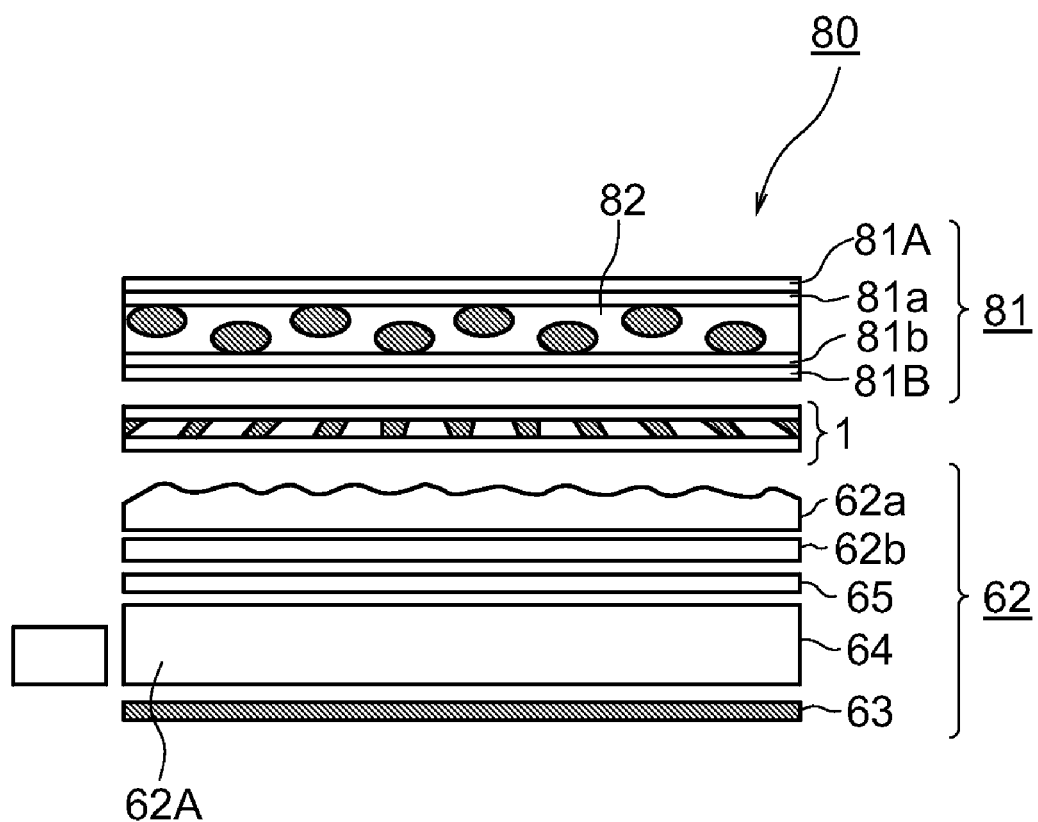
FIG. 18 is a sectional view showing an example of a lighting optical device used for a display device, to which a transmission-scattering switching element that is formed by loading the microlouver according to the present invention is mounted.

FIG. 18 shows an example of a lighting optical device 80 having the microlouver (optical element) 1 according to the present invention loaded inside thereof.

The lighting optical device 80 shown in FIG. 18 is formed with the lighting optical device 62 disclosed in FIG. 17 described above, the microlouver (optical element) 1 laminated on the lighting optical device 62, and a transmission-scattering switching element 81 laminated on the microlouver (optical element) 1.

That is, it is a feature of this case that the lighting optical device 80 is formed by sequentially laminating the microlouver (optical element) 1 and the transmission-scattering switching element 81 on the lighting optical device 62 shown in FIG. 17 described above.

The transmission-scattering switching element 81 is a PNLC (Polymer Network Liquid Crystal), for example, and it includes a substrate 81A where a transparent electrode 81a is provided, a substrate 81B where a transparent electrode 81b is provided, and a liquid crystal 82 as well as a polymer chain sandwiched between the substrates 81A and 81B.

In a state where a voltage is applied between the transparent electrodes 81a and 81b, the refractive indexes of the polymer chain and the liquid crystal 82 coincide with each other, and the transmission-scattering switching element 81 becomes transparent. In the transparent state, the light from the microlouver 1 transmits through the transmission-scattering switching element 81 as it is.

In the meantime, in a state where a voltage is not applied between the transparent electrodes 81a and 81b, the refractive indexes of the polymer chain and the liquid crystal 82 do not coincide with other, and the light from the microlouver 1 is scattered when passing through the transmission-scattering switching element 81. As described, the transmission-scattering switching element 81 comes in a transparent state when a voltage is applied, and comes in a scattering state when a voltage is not applied.

With the lighting optical device 80 shown in FIG. 18, it is possible to have the light distribution property with which the light is converged to the screen center direction when the transmission-scattering switching element 81 is turned into a transparent state. In the meantime, in the scattering state, the light emitted from the microlouver 1 is scattered, so that the range of emission angles becomes wider. As described, the range of emission angles of the lighting optical device 80 can be changed by switching the transmission-scattering switching element 81 to a transmission state or to a scattering state.

Note here that the transmission-scattering switching element 81 may be attached adhesively to the microlouver 1 via a transparent adhesive layer. With this structure, a surface reflection loss in the interface between the microlouver 1 and the transmission-scattering switching element 81 can be decreased, so that illumination light of still higher luminance can be acquired.

(Display Device 3)

Figure 19:
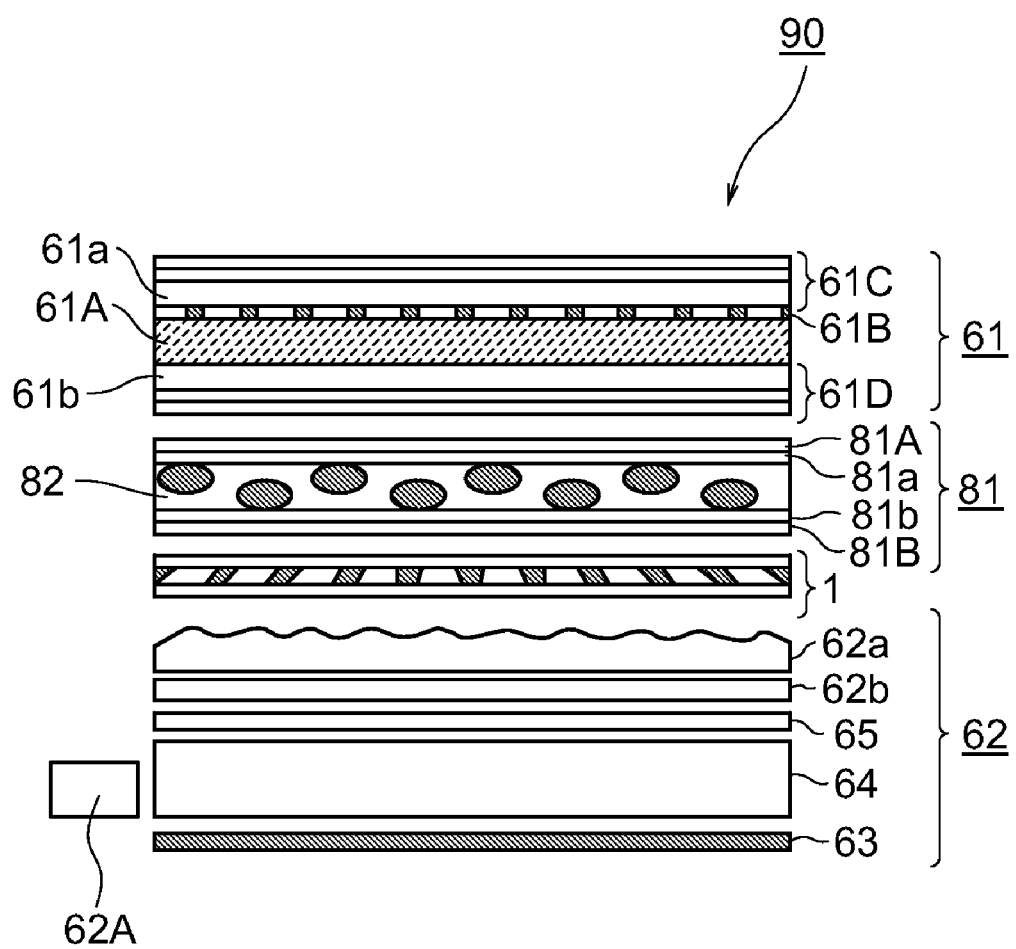
FIG. 19 is a sectional view showing an example of a display device that is formed by loading the microlouver according to the present invention inside thereof and a transmission-scattering switching element.
Figure 20:
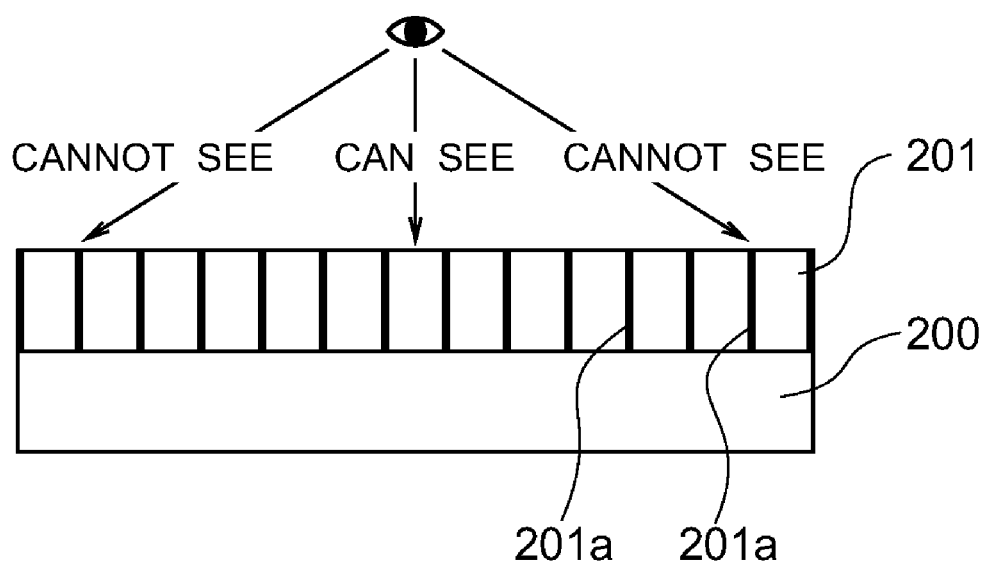
FIG. 20 is a sectional schematic view showing an example of a microlouver used in a large-scaled display of a related technique.

FIG. 19 shows an example of a display device 90 to which the lighting optical device 80 shown in FIG. 18 described above is mounted.

It is a feature of the display device 90 shown in FIG. 19 that the optical control element 61 described above (disclosed in FIG. 16 and FIG. 17) is laminated on the lighting optical device 80 of FIG. 18 described above.

That is, the display device 90 shown in FIG. 19 is formed with the optical control element 61 and the lighting optical device 80 that lights up the optical control element 61. Among those, the lighting optical device 80 is formed with the lighting optical device 62, the microlouver 1, and the transmission-scattering switching element 81, which are laminated sequentially from the bottom side as disclosed in FIG. 18.

As described in the first exemplary embodiment, the microlouver 1 has the light distribution property with which the light (internal light) from the optical control element 61 is converged to the screen center direction. As disclosed in FIG. 16, the lighting optical device 62 is formed with a light source 62A, a reflection sheet 63, a light guide plate 64, a diffusion plate 65, and prism sheets 62b, 62a, and it is structured to feed the light passing through the prism sheets 62b, 62a to the transmission-scattering switching element 81 that is in the structure disclosed in FIG. 18 via the microlouver 1.

Therefore, with the display device 90 disclosed in FIG. 19, it is possible to have the light distribution property with which the light is converged to the screen center direction when the transmission-scattering switching element 81 is turned into a transparent state. In the meantime, in the scattering state, the light emitted from the microlouver 1 is scattered, so that the range of emission angles in the display panel becomes wider.

In this case, the visible range becomes wider because the light is scattered, so that a plurality of people can view the display screen simultaneously.

In the display device 90 shown in FIG. 19, the microlouver 1 and the substrate 81A of the transmission-scattering switching element 81 and/or the polarization plate/phase difference plate 61D of the optical control element 61 and the substrate 81B of the transmission-scattering switching element 81 may be laminated via a transparent adhesive layer. With this structure, a surface reflection loss in the interface between the microlouver 1 and the substrate 81B and the interface between the polarization plate/phase difference plate 61D and the substrate 81A can be decreased, so that illumination light of still higher luminance can be acquired.

Regarding each of the above-described display devices 60, 70, and 90, an input device may further be provided on the uppermost layer thereof. The input device of this case may be the so-called touch panel that includes a counter electrode configured with an upper transparent electrode and a lower transparent electrode, and input information of the display panel is inputted based on a local pressure or changes in the resistance on the upper transparent electrode. The method of touch panel is not limited to be a resistance film method. An existing type such as a capacitance coupling method may also be employed.

An example of applying the present invention to portable information terminals as other electronic apparatuses such as mobile phones, notebook personal computers, or PDAs is a case where one of the above-described display devices 60, 70, and 90 is loaded as a display module in an apparatus main body of an electronic apparatus, for example. Further, the present invention may also be applied to various kinds of display devices such as organic EL (Electro Luminescence) type and plasma type.

In such case, a control device in the information processing terminal is structured to perform controls for receiving input from an input device such as a mouse and a keyboard and displaying necessary information on a display device loaded as a display module.

A part of or the entire part of the exemplary embodiments can also be depicted as in following Supplementary Notes. However, it is to be noted that the present invention is not limited to the following structures.

(Supplementary Note 1)

An optical element manufacturing method, which includes: laminating a transparent photosensitive resin on a transparent substrate; bending at least a part of the transparent substrate on which the transparent photosensitive resin is laminated, and holding the transparent substrate by an exposure device; irradiating exposure light constituted with parallel light towards the transparent photosensitive resin while keeping a state of bending at least a part of the transparent substrate to perform patterning on the transparent photosensitive resin so as to form a plurality of sectioned transparent layers; setting the transparent substrate in a bent state to an original flat state after forming the transparent layer; and filling a black curable resin in spaces located between each of the transparent layers formed by the patterning to form light absorption layers.

(Supplementary Note 2)

The optical element manufacturing method depicted in Supplementary Note 1, which includes: forming a light-shielding pattern on a surface of the transparent substrate before laminating the transparent photosensitive resin on the transparent substrate; and irradiating the exposure light from the transparent substrate side when irradiating the exposure light constituted with the parallel light towards the transparent photosensitive resin.

(Supplementary Note 3)

The optical element manufacturing method depicted in Supplementary Note 1, wherein: when bending at least a part of the transparent substrate and holding the transparent substrate by the exposure device, the transparent substrate is held by the exposure device by closely fitting the transparent photosensitive resin and an exposure photomask; and when irradiating exposure light constituted with the parallel light towards the transparent photosensitive resin while keeping the state of bending at least a part of the transparent substrate, the exposure light is irradiated towards the transparent photosensitive resin from the exposure photomask side while keeping the state of bending at least a part of the transparent substrate and the exposure photomask.

(Supplementary Note 4)

The optical element manufacturing method depicted in any on of Supplementary Notes 1-3, wherein: in a substrate holding step which holds the transparent substrate by bending at least a part of the transparent substrate, a bent face of a curvature in the bent state that is set by being subjected at least to a part of surfaces of a periphery of the transparent substrate is an arc continuous body raised from the surface of the transparent substrate.

(Supplementary Note 5)

The optical element manufacturing method depicted in any one of Supplementary Notes 1-4, wherein a curvature direction of the bent part of the transparent substrate where the transparent photosensitive resin is formed is a direction with which the surface where the transparent photosensitive resin is laminated comes in a convex form.

(Supplementary Note 6)

The optical element manufacturing method depicted in any one Supplementary Notes 1-4, wherein a curvature direction of the bent part of the transparent substrate where the transparent photosensitive resin is formed is a direction with which the surface where the transparent photosensitive resin is laminated comes in a concave form.

(Supplementary Note 7)

The optical element manufacturing method depicted in any one Supplementary Notes 1-6, wherein the transparent substrate is formed by a polymer resin.

(Supplementary Note 8)

The optical element manufacturing method depicted in Supplementary Note 3, wherein in a substrate holding step which holds the transparent substrate and the exposure photomask by bending at least a part thereof, a bent face of a curvature in the bent state that is set by being subjected at least to a part of surfaces of a periphery of the transparent substrate and the exposure photomask is an arc continuous body raised from the surface of the transparent substrate.

(Supplementary Note 9)

The optical element manufacturing method depicted in Supplementary Note 3 or 8, wherein the base material of the exposure photomask is made of a transparent resin such as PET or PEN.

(Supplementary Note 10)

The optical element manufacturing method depicted in Supplementary Note 3 or 8, wherein the base material of the exposure photomask is made of glass.

(Supplementary Note 11)

An optical element exposure device, which includes: a stage section including a stage face on which a transparent substrate that is formed with a material capable of transmitting exposure light and includes a transparent photosensitive resin laminated on its external face is loaded and held; an inner-face light-shielding structure provided on an inner-face side of the stage section to cover an entire surface except an exposure region of the stage face; position detection sensors for position alignment placed on an upper part of the stage face at a prescribed interval by corresponding to alignment marks used for setting an exposure position set in advance in the transparent photosensitive resin part of the transparent substrate; and an exposure light irradiation module that operates and irradiates the exposure light for a prescribed time towards the transparent substrate from the inside the stage to perform patterning processing on the transparent photosensitive resin, when the transparent substrate is loaded at the exposure position on the stage face and the alignment marks on the transparent photosensitive resin are detected by the position detection sensors, wherein at least a part of the stage face of the stage section is formed as a surface structure of a bent state in a convex form.

(Supplementary Note 12)

The optical element exposure device depicted in Supplementary Note 11, wherein a surface structure of a bent state in a concave form is employed instead of the surface structure of the bent state in the convex form which configures at least a part of the stage face of the stage section.

(Supplementary Note 13)

The optical element exposure device depicted in Supplementary Note 11 or 12, wherein: the transparent substrate on which the transparent photosensitive resin as a target of irradiating the exposure light is laminated is formed as a belt-type transparent substrate in which a plurality of the transparent substrates are connected continuously in a belt form in advance; a transparent substrate feeding roller around which the belt-type transparent substrate is wound in a roll form is provided on one of side faces of the stage section, and a take-up roller that takes up the belt-type transparent substrate after being subjected to patterning processing is provided to the other side face of the stage section; and guiding rollers for the belt-type transparent substrate are loaded, respectively, between the transparent substrate feeding roller and the stage face and between the stage face and the take-up roller.

(Supplementary Note 14)

The optical element exposure device depicted in any one of Supplementary Notes 11-13, wherein the transparent substrate is formed by laminating the transparent photosensitive resin via light-shielding patterns.

(Supplementary Note 15)

The optical element exposure device depicted in any one of Supplementary Notes 11-13, wherein the stage face loads and holds the exposure photomask that is closely fitted to the transparent photosensitive resin in addition to the transparent substrate.

(Supplementary Note 21)

An optical element that includes transparent layers and light absorption layers alternately on a transparent substrate within a same plane, wherein interfaces between the transparent layers and the light absorption layers are set to be upright at 90 degrees with respect to the surface of the transparent substrate in a center region of the transparent substrate, and at least a part of a peripheral region surrounding the center region is in a state tilted towards the center region.

(Supplementary Note 22)

An optical element that includes transparent layers and light absorption layers alternately on a transparent substrate within a same plane, wherein interfaces between the transparent layers and the light absorption layers are set to be upright at 90 degrees with respect to the surface of the transparent substrate in a center region of the transparent substrate, and at least a part of a peripheral region surrounding the center region is in a state tilted towards a direction of an opposite side of the center region, respectively.

(Supplementary Note 23)

The optical element as depicted in Supplementary Note 21 or 22, wherein a tilt angle with respect to a plane of the transparent substrate in the interfaces between the transparent layers and the light absorption layers is set to be wider in a peripheral part than a center part of the optical element.

(Supplementary Note 24)

The optical element depicted in Supplementary Note 21 or 22, wherein a plurality of the interfaces formed between a plurality of the transparent layers and a plurality of the light absorption layers include those that are not in a parallel relation with each other.

(Supplementary Note 25)

The optical element depicted in Supplementary Note 21, wherein regarding a sectional shape of the transparent layers, a top-end width is set to be narrower than a width on the transparent substrate surface as a base-end side.

(Supplementary Note 26)

The optical element depicted in Supplementary Note 22, wherein regarding a sectional shape of the transparent layers, a top-end width is set to be wider than a width on the transparent substrate side as a base-end side.

(Supplementary Note 27)

The optical element depicted in any one of Supplementary Notes 21-26, wherein the light absorption layer is formed with two layers of a black curable resin and a light-shielding pattern.

(Supplementary Note 28)

The optical element depicted in any one of Supplementary Notes 21-26, wherein the light absorption layer is formed with one layer of a black curable resin.

(Supplementary Note 31)

A lighting optical device that includes the optical element depicted in any one of Supplementary Notes 21-28, and a surface light source provided to a back face of the optical element.

(Supplementary Note 41)

A display device that includes: a display panel in which pixels are arranged in an orderly manner; the optical element depicted in any one Supplementary Notes 21-28, which is mounted into the display panel; and a surface light source that lights up the display panel, wherein light from the surface light source is irradiated to the display panel via the optical element.

(Supplementary Note 42)

The display device depicted in Supplementary Note 41, wherein the optical element is loaded in a display screen of the display panel to be freely detachable.

(Supplementary Note 43)

A display device that includes: a display panel in which pixels are arranged in an orderly manner; the optical element depicted in any one of Supplementary Notes 21-28, which is mounted into the display panel; a surface light source that lights up the display panel; and a transmission-scattering switching element that receives light from the surface light source via the optical element, and switches a transparent state which transmits and emits the light that makes incident thereon as it is and a scattering state which scatters the light that makes incident thereon and exits as diffused light, wherein the light emitted from the transmission-scattering switching element is irradiated to the display panel.

(Supplementary Note 51)

An electronic apparatus that includes the display device depicted in any one of Supplementary Notes 41-43 loaded thereon as a display module of an electronic apparatus main body.

While the invention has been particularly shown and described with reference to exemplary embodiments thereof, the invention is not limited to these embodiments. It will be understood by those of ordinary skill in the art that various changes in form and details may be made therein without departing from the spirit and scope of the present invention as defined by the claims.

INDUSTRIAL APPLICABILITY

The microlouver (optical element) 1 according to the present invention is used for various kinds of display devices such as organic EL types and plasma types other than liquid crystal display devices that are used as display devices of various kinds of information processing devices such as mobile phones, portable information terminals (PDAs), ATMs, and personal computers.

What is claimed is:

1. An optical element manufacturing method, comprising:
    laminating a transparent photosensitive resin on a transparent substrate;
    bending at least a part of the transparent substrate on which the transparent photosensitive resin is laminated, and holding the transparent substrate by an exposure device;
    irradiating exposure light constituted with parallel light towards the transparent photosensitive resin while keeping a state of bending at least a part of the transparent substrate to perform patterning on the transparent photosensitive resin so as to form a plurality of sectioned transparent layers;
    setting the transparent substrate in a bent state to an original flat state after forming the transparent layers; and
    filling a black curable resin in spaces located between each of the transparent layers formed by the patterning to form light absorption layers.

2. The optical element manufacturing method as claimed in claim 1, comprising:
    forming light-shielding patterns on a surface of the transparent substrate before laminating the transparent photosensitive resin on the transparent substrate; and
    irradiating the exposure light from the transparent substrate side when irradiating the exposure light constituted with the parallel light towards the transparent photosensitive resin.

3. The optical element manufacturing method as claimed in claim 1, wherein:
    when bending at least a part of the transparent substrate and holding the transparent substrate by the exposure device, the transparent substrate is held by the exposure device by closely fitting the transparent photosensitive resin and an exposure photomask; and
    when irradiating exposure light constituted with the parallel light towards the transparent photosensitive resin while keeping the state of bending at least a part of the transparent substrate, the exposure light is irradiated towards the transparent photosensitive resin from the exposure photomask side while keeping the state of bending at least a part of the transparent substrate and the exposure photomask.

4. The optical element manufacturing method as claimed in claim 1, wherein:
    in a substrate holding step which holds the transparent substrate by bending at least a part of the transparent substrate, a bent face of a curvature in the bent state that is set by being subjected at least to a part of surfaces of a periphery of the transparent substrate is an arc continuous body raised from the surface of the transparent substrate.

5. The optical element manufacturing method as claimed in claim 1, wherein
    a curvature direction of the bent part of the transparent substrate where the transparent photosensitive resin is formed is a direction with which the surface where the transparent photosensitive resin is laminated comes in a convex form.

6. The optical element manufacturing method as claimed in claim 1, wherein
    a curvature direction of the bent part of the transparent substrate where the transparent photosensitive resin is formed is a direction with which the surface where the transparent photosensitive resin is laminated comes in a concave form.

7. An optical element exposure device, comprising:
    a stage section including a stage face on which a transparent substrate that is formed with a material capable of transmitting exposure light and includes a transparent photosensitive resin laminated on its external face is loaded and held;
    an inner-face light-shielding structure provided on an inner-face side of the stage section to cover an entire surface except an exposure region of the stage face;
    position detection sensors for position alignment placed on an upper part of the stage face at a prescribed interval by corresponding to alignment marks used for setting an exposure position set in advance in the transparent photosensitive resin part of the transparent substrate; and
    an exposure light irradiation module that operates and irradiates the exposure light for a prescribed time towards the transparent substrate from the inside the stage to perform patterning processing on the transparent photosensitive resin, when the transparent substrate is loaded at the exposure position on the stage face and the alignment marks on the transparent photosensitive resin are detected by the position detection sensors, wherein
    at least a part of the stage face of the stage section is formed as a surface structure of a bent state in a convex form.

8. The optical element exposure device as claimed in claim 7, wherein
    a surface structure of a bent state in a concave form is employed instead of the surface structure of the bent state in the convex form which configures at least a part of the stage face of the stage section.

9. The optical element exposure device as claimed in claim 7, wherein:
    the transparent substrate on which the transparent photosensitive resin as a target of irradiating the exposure light is laminated is formed as a belt-type transparent substrate in which a plurality of the transparent substrates are connected continuously in a belt form in advance;
    a transparent substrate feeding roller around which the belt-type transparent substrate is wound in a roll form is provided on one of side faces of the stage section, and a take-up roller that takes up the belt-type transparent substrate after being subjected to patterning processing is provided to the other side face of the stage section; and guiding rollers for the belt-type transparent substrate are loaded, respectively, between the transparent substrate feeding roller and the stage face and between the stage face and the take-up roller.

10. An optical element, comprising transparent layers and light absorption layers alternately on a transparent substrate within a same plane, wherein
interfaces between the transparent layers and the light absorption layers are set to be upright at 90 degrees with respect to a surface of the transparent substrate in a center region of the transparent substrate, the interfaces tilt towards the center region at greater distances from the center region in one direction, and the interfaces tilt in the same direction and at the same angle in another direction perpendicular to the one direction.

11. The optical element as claimed in claim 10, wherein a tilt angle with respect to a plane of the transparent substrate in the interfaces between the transparent layers and the light absorption layers is set to be wider in a peripheral part than a center part of the optical element.

12. The optical element as claimed in claim 10, wherein a plurality of the interfaces formed between a plurality of the transparent layers and a plurality of the light absorption layers include those that are not in a parallel relation with each other.

13. A lighting optical device, comprising:
the optical element claimed in claim 10; and
a surface light source provided to a back face of the optical element.

14. A display device, comprising:
a display panel in which pixels are arranged in an orderly manner;
the optical element claimed in claim 10, which is mounted into the display panel; and
a surface light source that lights up the display panel, wherein
light from the surface light source is irradiated to the display panel via the optical element.

15. The display device as claimed in claim 14, wherein the optical element is loaded in a display screen of the display panel to be freely detachable.

16. An electronic apparatus, comprising the display device claimed in claim 14 loaded thereon as a display module of an electronic apparatus main body.

17. A display device, comprising:
a display panel in which pixels are arranged in an orderly manner;
the optical element claimed in claim 10, which is mounted into the display panel;
a surface light source that lights up the display panel; and
a transmission-scattering switching element that receives light from the surface light source via the optical element, and switches a transparent state which transmits and emits the light that makes incident thereon as it is and a scattering state which scatters the light that makes incident thereon and exits as diffused light, wherein
the light emitted from the transmission-scattering switching element is irradiated to the display panel.

18. An optical element, comprising transparent layers and light absorption layers alternately on a transparent substrate within a same plane, wherein
interfaces between the transparent layers and the light absorption layers are set to be upright at 90 degrees with respect to the surface of the transparent substrate in a center region of the transparent substrate, the interfaces tilt towards a direction of an opposite side of the center region at greater distances from the center region in one direction, and the interfaces tilt in the same direction and at the same angle in another direction perpendicular to the one direction.

19. An optical element, comprising transparent layers and light absorption layers alternately on a transparent substrate within a same plane, wherein
interfaces between the transparent layers and the light absorption layers are set to be upright at 90 degrees with respect to a surface of the transparent substrate in a center region of the transparent substrate, and at least a part of a peripheral region surrounding the center region is in a state tilted towards the center region, and
regarding a sectional shape of the transparent layers, a top-end width is set to be narrower than a width on the transparent substrate surface as a base-end side.

20. An optical element, comprising transparent layers and light absorption layers alternately on a transparent substrate within a same plane, wherein
interfaces between the transparent layers and the light absorption layers are set to be upright at 90 degrees with respect to the surface of the transparent substrate in a center region of the transparent substrate, and at least a part of a peripheral region surrounding the center region is in a state tilted towards a direction of an opposite side of the center region, respectively, and
regarding a sectional shape of the transparent layers, a top-end width is set to be wider than a width on the transparent substrate side as a base-end side.

* * * * *